(12) United States Patent
Kutsukake et al.

(10) Patent No.: US 8,791,517 B2
(45) Date of Patent: Jul. 29, 2014

(54) SEMICONDUCTOR DEVICE

(75) Inventors: Hiroyuki Kutsukake, Yokohama (JP);
Yoshiko Kato, Yokohama (JP);
Yoshihisa Watanabe, Yokohama (JP);
Koichi Fukuda, Yokohama (JP);
Kazunori Masuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 461 days.

(21) Appl. No.: 13/052,152

(22) Filed: Mar. 21, 2011

(65) Prior Publication Data
US 2012/0032243 A1 Feb. 9, 2012

(30) Foreign Application Priority Data

Aug. 4, 2010 (JP) .................................. 2010-175693

(51) Int. Cl.
*H01L 29/78* (2006.01)
*H01L 29/92* (2006.01)

(52) U.S. Cl.
USPC .......................................................... 257/299

(58) Field of Classification Search
USPC ............................ 257/296, 298, 299, E29.345
See application file for complete search history.

(56) References Cited

U.S. PATENT DOCUMENTS

| | | | | |
|---|---|---|---|---|
| 5,786,617 A * | 7/1998 | Merrill et al. | .................. | 257/371 |
| 6,548,855 B1 * | 4/2003 | Ramsbey et al. | .............. | 257/314 |
| 7,800,154 B2 | 9/2010 | Noguchi et al. | | |
| 2002/0060333 A1 * | 5/2002 | Tanaka et al. | .................. | 257/299 |
| 2003/0057469 A1 * | 3/2003 | Karaki | .......................... | 257/299 |
| 2003/0164511 A1 * | 9/2003 | Kaneko et al. | ................ | 257/215 |
| 2003/0197246 A1 * | 10/2003 | Ker et al. | ....................... | 257/565 |
| 2005/0079668 A1 * | 4/2005 | Jung | .............................. | 438/232 |
| 2006/0239083 A1 * | 10/2006 | Lee | ........................... | 365/185.28 |
| 2008/0239789 A1 * | 10/2008 | Shino et al. | .................... | 365/149 |
| 2008/0283896 A1 | 11/2008 | Noguchi et al. | | |
| 2010/0176872 A1 * | 7/2010 | Saikusa et al. | ................ | 327/536 |
| 2010/0226166 A1 * | 9/2010 | Jung et al. | ..................... | 365/149 |

FOREIGN PATENT DOCUMENTS

JP 2002-217304 A 8/2002

OTHER PUBLICATIONS

Hu, "Chapter 5, MOS Capacitors", Feb. 2009, pp. 157-194, http://www.eecs.berkeley.edu/~hu/Chenming-Hu_ch5.pdf.*

* cited by examiner

*Primary Examiner* — Michele Fan
(74) *Attorney, Agent, or Firm* — Oblon, Spivak, McClelland, Maier & Neustadt, L.L.P.

(57) ABSTRACT

According to one embodiment, a semiconductor device includes at least one semiconductor region provided in a semiconductor substrate, and a capacitor group including a plurality of capacitors provided in the semiconductor region, each capacitor including a capacitor insulating film provided on the semiconductor region, a capacitor electrode provided on the capacitor insulating film, and at least one diffusion layer provided in the semiconductor region adjacent to the capacitor electrode.

6 Claims, 19 Drawing Sheets

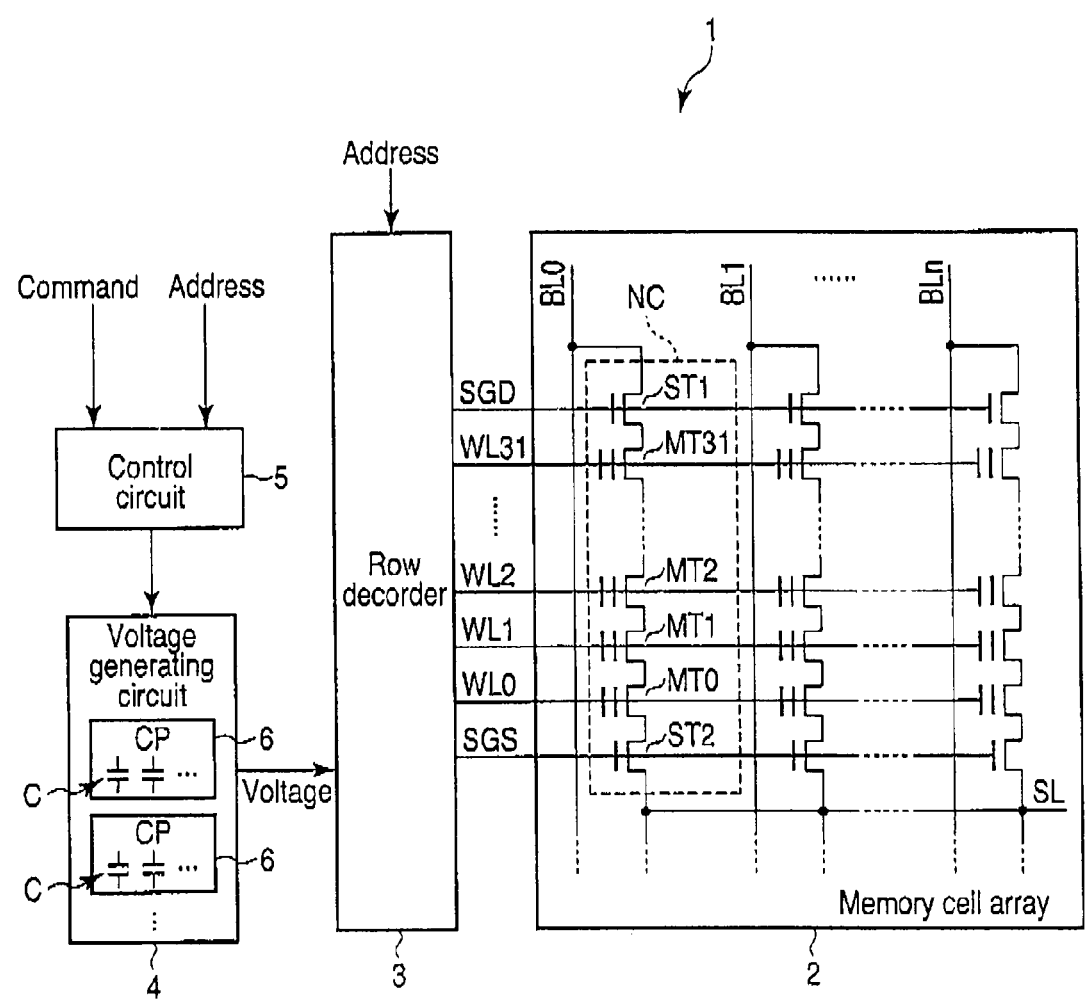
F I G. 1

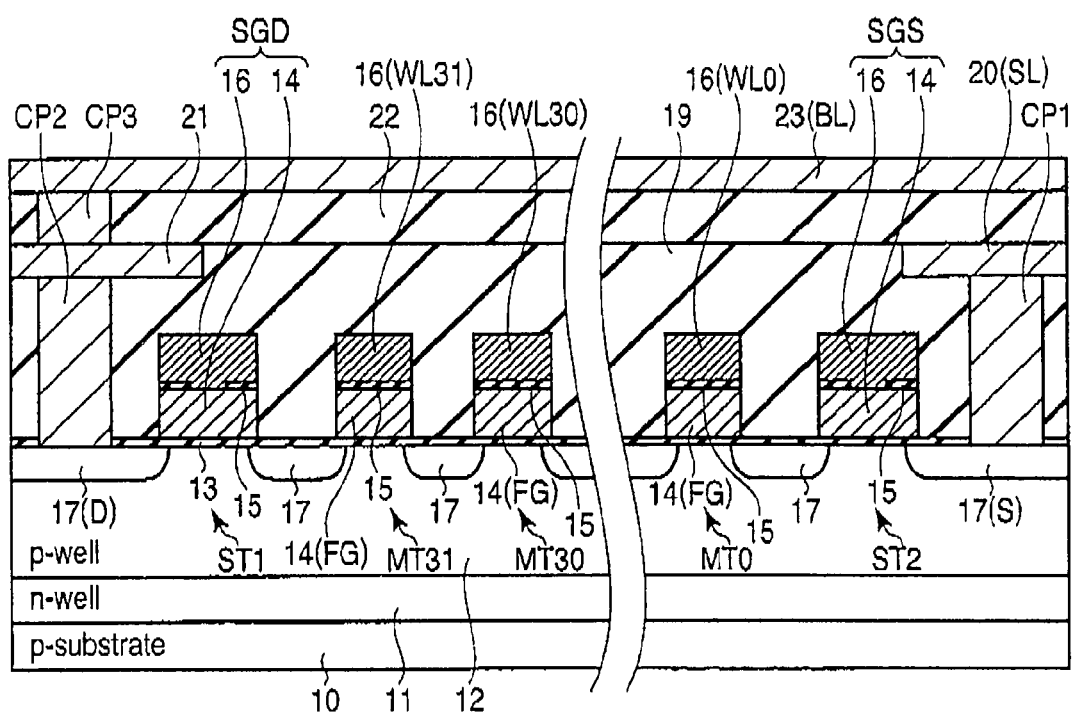
F I G. 3

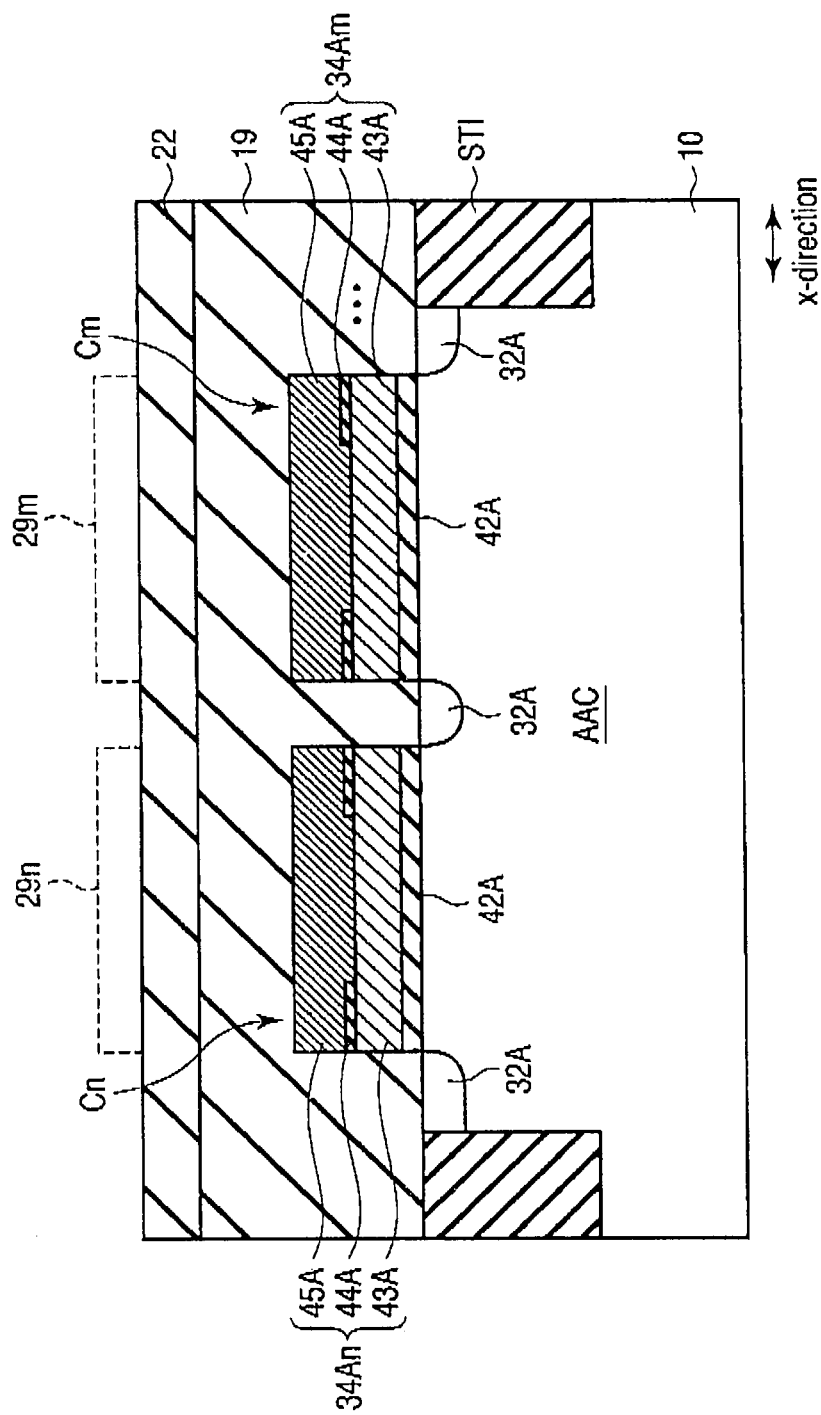
F I G. 5

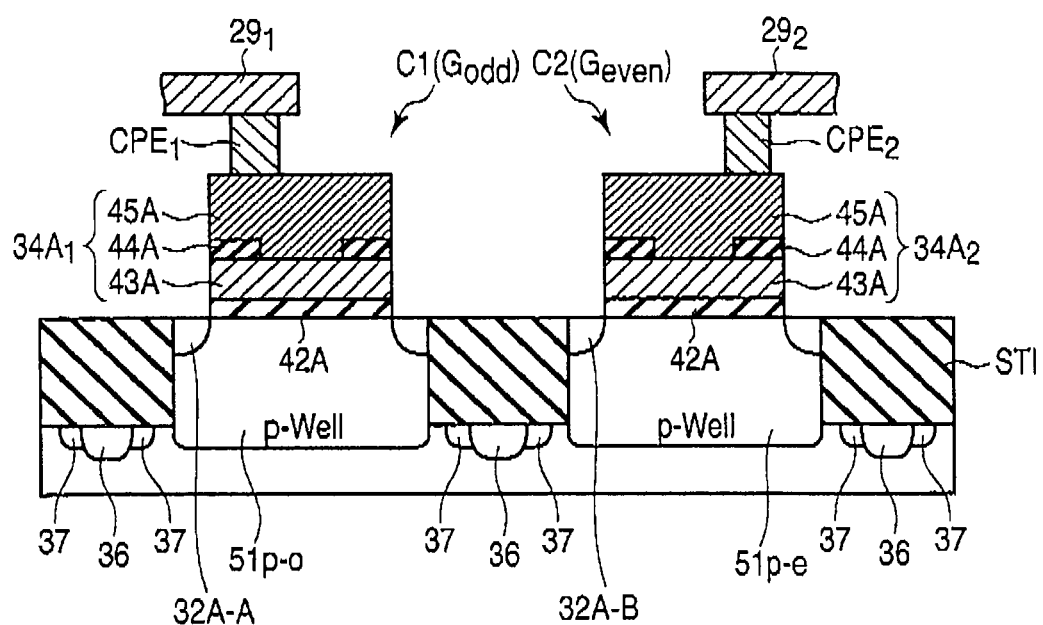
F I G. 10

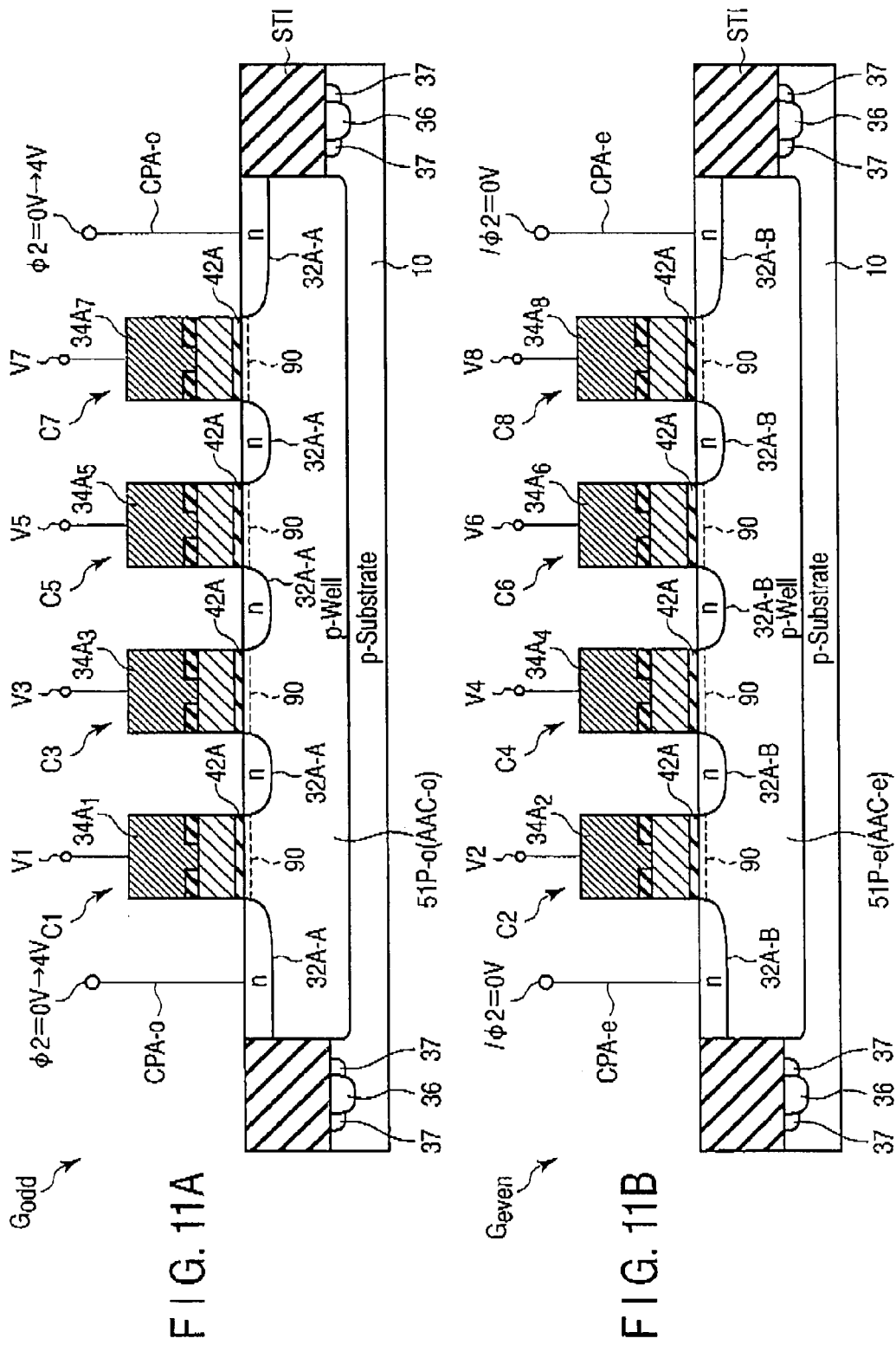
F I G. 11A
F I G. 11B

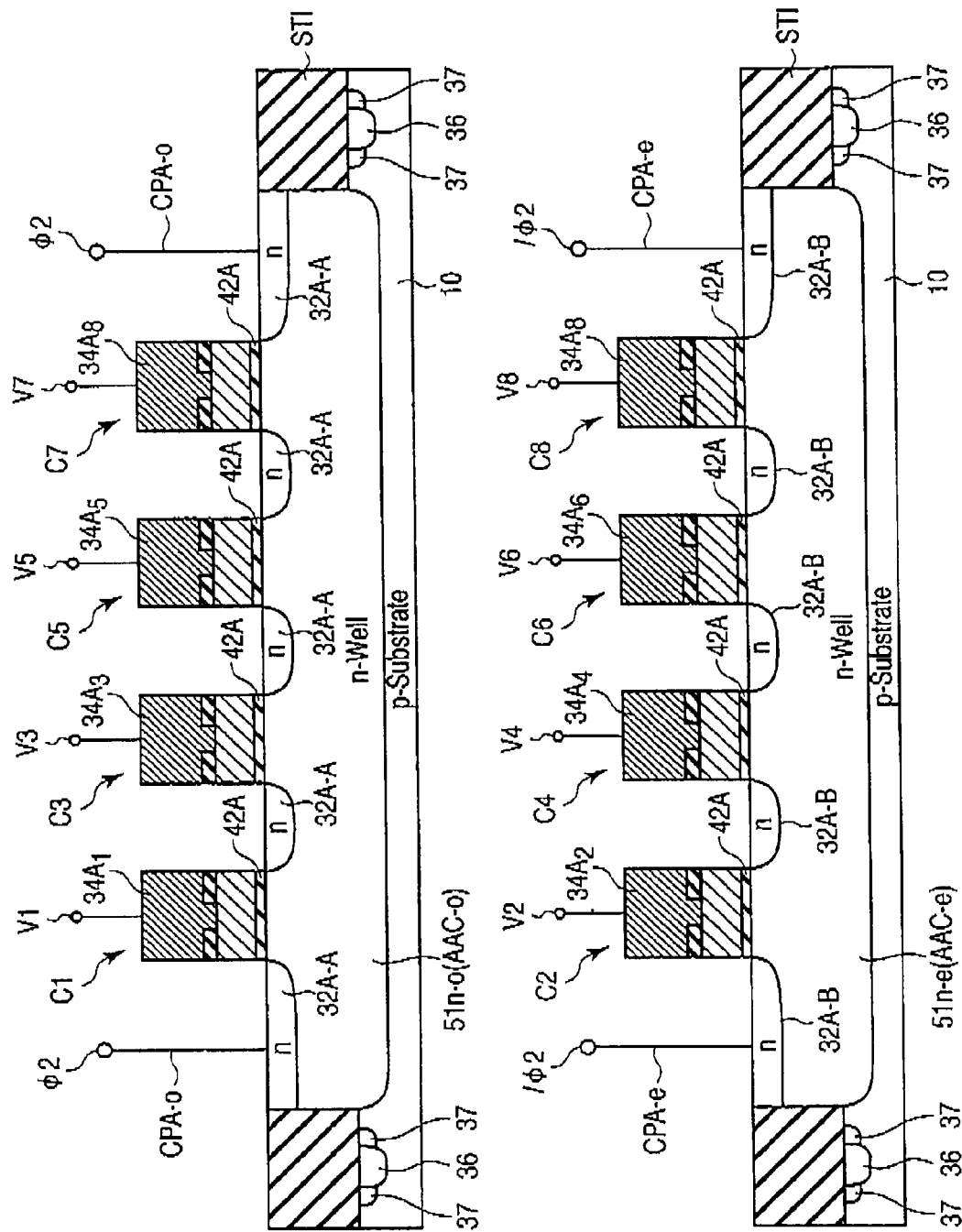
F I G. 13A
F I G. 13B

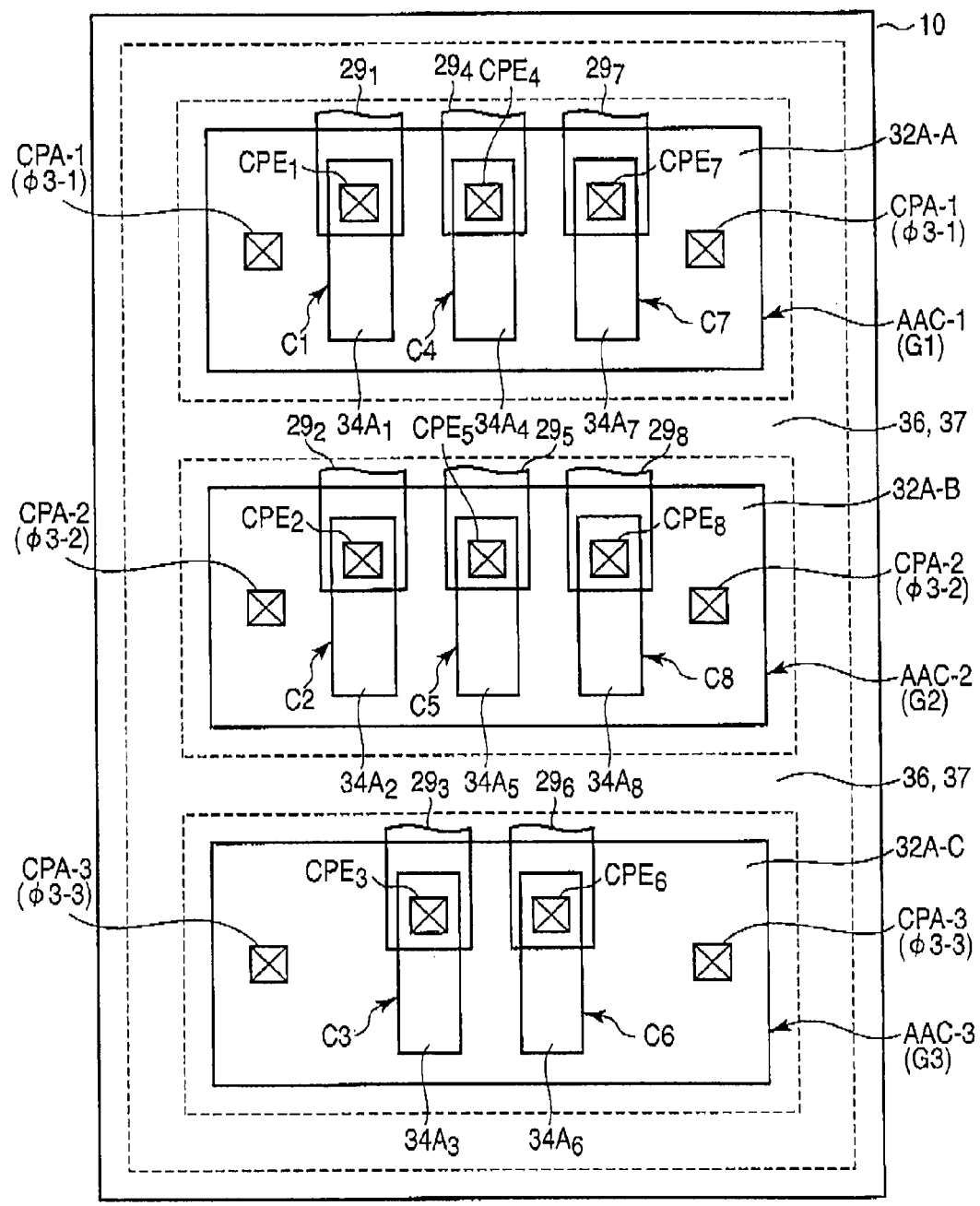
F I G. 16

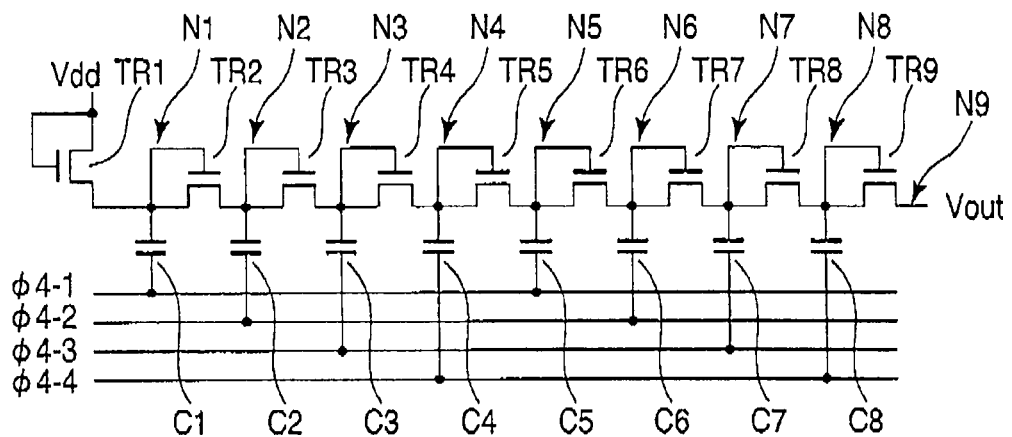
F I G. 18
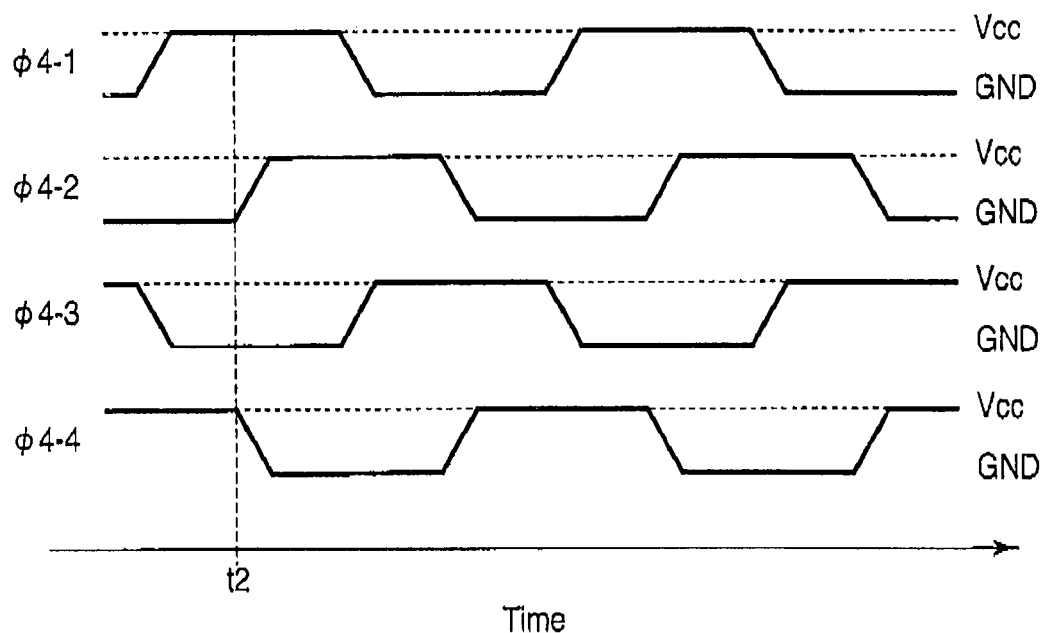
F I G. 19

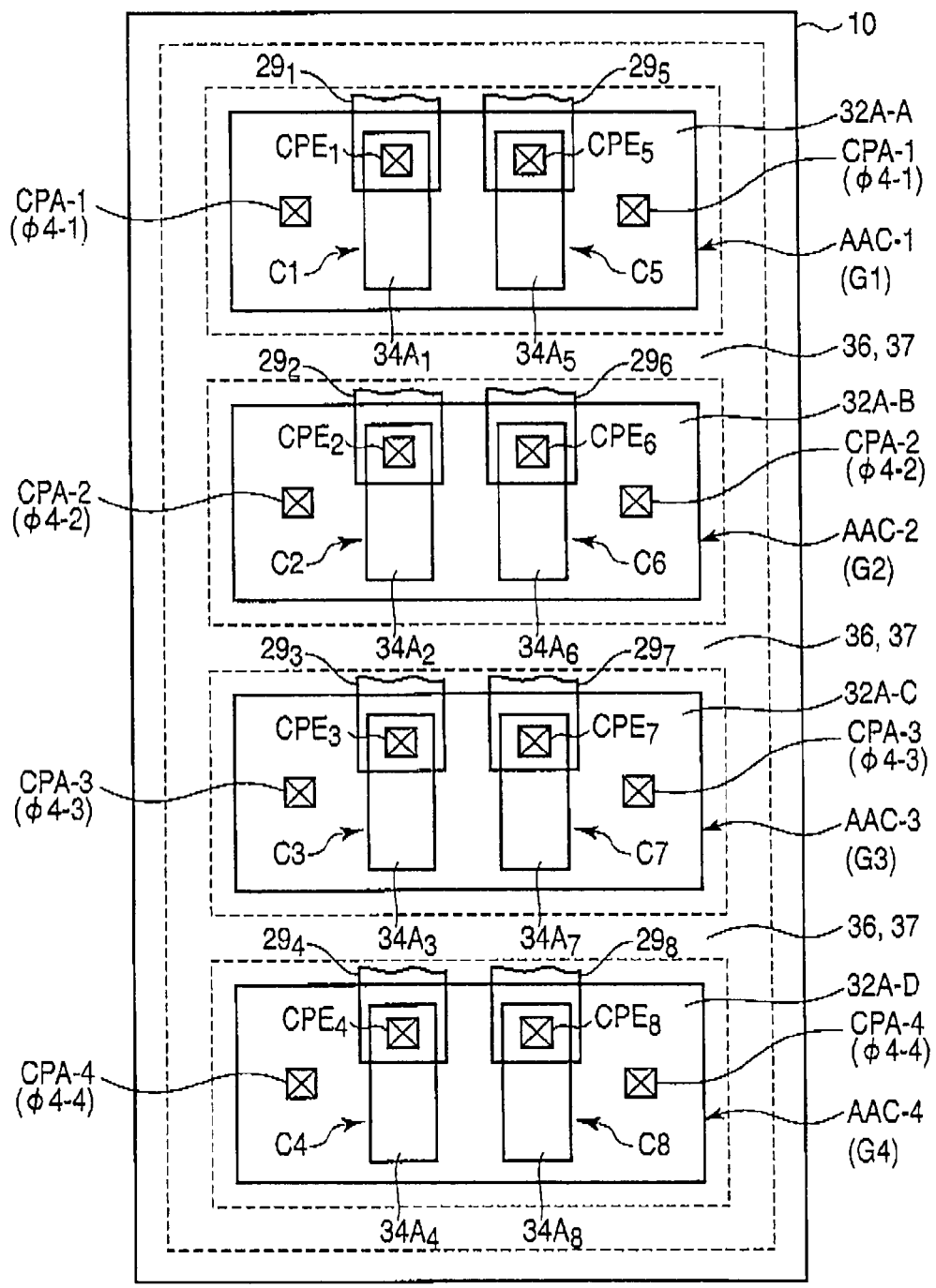
F I G. 20

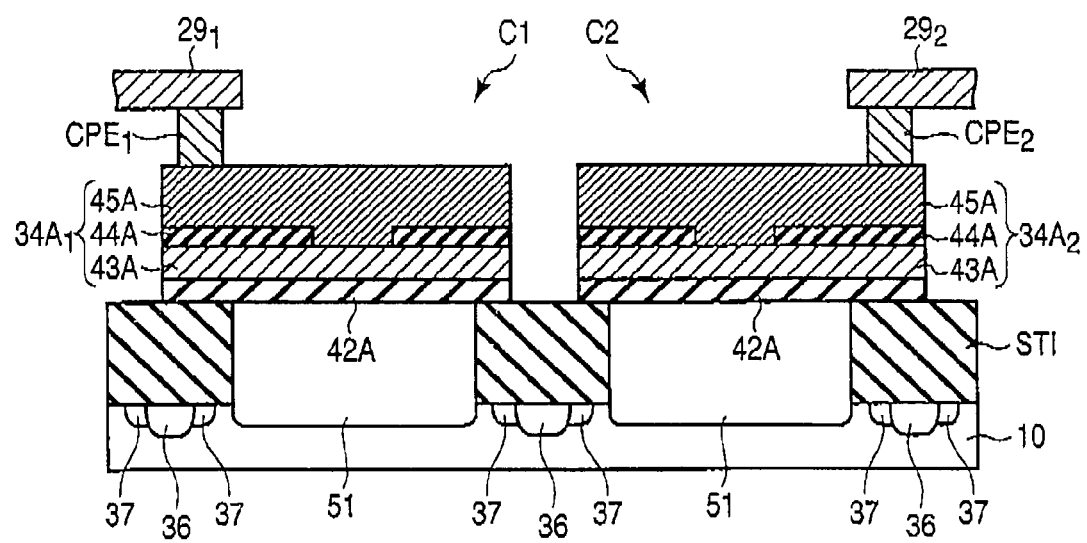
F I G. 22

SEMICONDUCTOR DEVICE

CROSS-REFERENCE TO RELATED APPLICATIONS

This application is based upon and claims the benefit of priority from Japanese Patent Application No. 2010-175693, filed Aug. 4, 2010; the entire contents of which are incorporated herein by reference.

FIELD

Embodiments described herein relate generally to a semiconductor device.

BACKGROUND

Nonvolatile semiconductor memories such as flash memories are used, as semiconductor storage, in various electronic apparatuses.

In any flash memory, a voltage of about 10 to 20 V is applied to the gate electrodes of the memory cell transistors to write data. To generate a high voltage of 10 V or more, a so-called "charge pump circuit" is arranged in a peripheral circuit of the flash memory.

The charge pump circuit comprises, for example, a plurality of MOS transistors and a plurality of capacitors. Each MOS transistor has its drain connected to the gate of another MOS transistor. The capacitors of the charge pump circuit are, for example, MOS capacitors. Each MOS capacitor is provided in one semiconductor region (element region) that is surrounded by an isolation region.

The charge pump circuit needs to have a plurality of MOS transistor groups and a plurality of MOS capacitor groups, in order raise the power-supply voltage (about 3 V) to about 20 V. The charge pump circuit therefore occupies a large area. Inevitably, the area the charge pump circuit occupies tends to increase.

As a result of this, the area for the memory cell array and the area for the peripheral circuit inevitably are limited. This makes it difficult to increase the storage capacity of the flash memory, to reduce the memory chip size and to lower the bit cost.

BRIEF DESCRIPTION OF THE DRAWINGS

FIG. 1 is a block diagram showing the configuration of a flash memory;

FIG. 3 is a sectional view showing the structure of a memory cell array;

FIG. 5 is a sectional view explaining the structure of a semiconductor device according to a first embodiment;

FIG. 10 is a diagram explaining the structure of one of the capacitors in the charge pump circuit;

FIG. 11A and FIG. 11B are diagrams explaining the structure and operation of the capacitors in the charge pump circuit;

FIG. 13A and FIG. 13B are sectional views explaining the structure of a semiconductor device according to a second embodiment;

FIG. 16 is a plan view showing the layout of the capacitors in the charge pump circuit;

FIG. 18 is an equivalent circuit diagram showing an exemplary configuration of the charge pump circuit in a fourth embodiment;

FIG. 19 is a waveform diagram showing control signals for the charge pump circuit;

FIG. 20 is a plan view showing the layout of the capacitors in the charge pump circuit;

FIG. 22 is a sectional view explaining the modification of the semiconductor devices according to the first to fourth embodiments.

DETAILED DESCRIPTION

Figure 2:
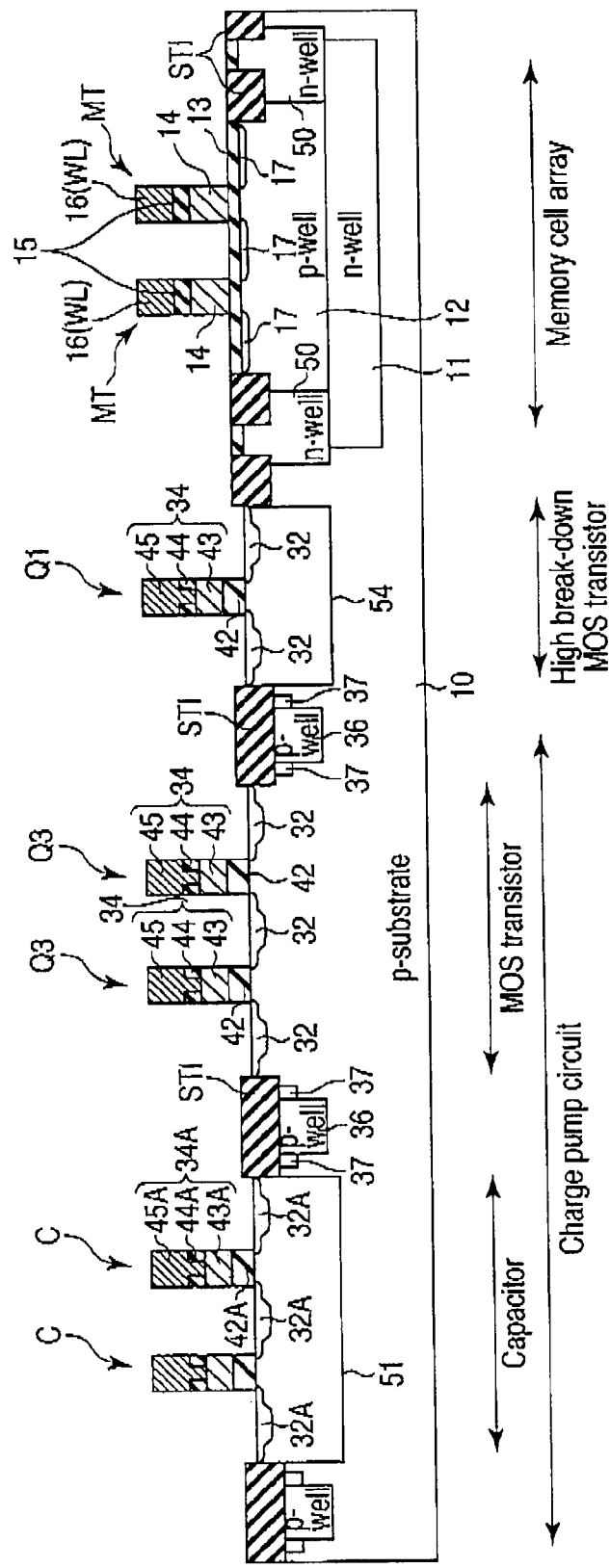
FIG. 2 is a sectional view schematically showing a cross section of the flash memory.

Embodiments will be described in detail, with reference to the accompanying drawings. In the following description, the components of any embodiment, which are identical in function and configuration to those of any other embodiment, will be designated by the same reference numbers and will be repeatedly described, only if necessary.

In general, according to one embodiment, a semiconductor device includes at least one semiconductor region provided in a semiconductor substrate; and a capacitor group including a plurality of capacitors provided in the semiconductor region, each capacitor including a capacitor insulating film provided on the semiconductor region, a capacitor electrode provided on the capacitor insulating film, and at least one diffusion layer provided in the semiconductor region adjacent to the capacitor electrode.

EMBODIMENTS

(1) First Embodiment

A semiconductor device according to a first embodiment will be described with reference to FIGS. 1 to 10, FIGS. 11A and 11B, and FIGS. 12A and 12B. The semiconductor device according to this embodiment is, for example, a flash memory.

(a) Configuration of the Flash Memory

FIG. 1 is a block diagram showing the configuration of the flash memory, which is the semiconductor device according to the first embodiment.

As shown in FIG. 1, the flash memory 1 has a memory cell array 2, a row decoder 3, a voltage generation circuit 4, and a control circuit 5.

The memory cell array 2 includes a plurality of memory cell transistors MT, each of which can hold data. Each memory cell transistor MT has stacked gate structure including a charge storage layer and a control gate. The charge storage layer can hold a charge. The control gate is formed on the charge storage layer. The control gate of each memory cell transistor MT is connected to a word line WL. The drain of the memory cell transistor MT is electrically connected to a bit line BL. The source of the memory cell transistor MT is electrically connected to a source line SL.

In order to write data, the word line WL associated with the write address is selected, a program voltage VPGM (e.g., 20 V) is applied to the word line WL selected, and an intermediate voltage VPASS or the like is applied to the word lines WL not selected. In order to read data, the word line WL associated with the read address is selected, a read voltage VCGR is applied to the word line WL selected, and a voltage VREAD is applied to the word lines not selected. The voltages VPASS and VREAD turn on the memory cells. To erase the data, 0 V is applied to the all word lines WL, and a high voltage (e.g., 20 V) is applied to the well region in which the memory cell array 2 is formed.

The internal structure of the memory cell array 2 will be described. The flash memory according to this embodiment is, for example, a NAND flash memory. The memory cell array 2 therefore includes a plurality of NAND cells NC as shown in FIG. 1.

Each of the NAND cells NC includes 32 memory cell transistors MT0 to MT31, two select transistors ST1 and ST2. The number of memory cell transistors MT included in the NAND cell is not limited to 32. The NAND cell may include 8 memory cell transistors, 16 memory cell transistors, 64 transistors, 128 transistors, 256 transistors, or the like. Hereinafter, the memory cell transistors MT0 to MT31 may be called "memory cell transistors MT," on some occasions, for the sake of simplicity.

Each memory cell transistors MT has a stacked gate structure. More precisely, the memory cell transistor MT has a first gate insulating film provided on a semiconductor substrate, a charge storage layer formed on the gate insulating film, an inter-gate insulating film provided on the charge storage layer, and a control gate electrode formed on the inter-gate insulting film. Any two adjacent memory cell transistors MT share the source and drain, and are arranged with their current paths connected in series between select transistors ST1 and ST2. The drain region at one end of the unit constituted by the serially connected memory cell transistors MT is connected to the source region of select transistor ST1, and the source region at the other end of this unit is connected to the drain region of select transistor ST2.

The control gate electrodes of the memory cell transistors MT arranged in the same row are connected to one of the word lines WL0 to WL31. Select transistors ST1 and ST2 arranged in the same row have their gates connected to select gate lines SGD and SGS, respectively. In the memory cell array, the drains of the select transistors ST1 arranged in the same column are connected to one of the bit lines BL0 to BLn (n is a natural number). Hereinafter, the word lines WL to WL31 and the bit lines BL0 to BLn may be called "word lines WL" and "bit lines BL" on some occasions, for the sake of simplicity. The source of select transistors ST2 are connected to the source line SL.

In FIG. 1, only one NAND cell is shown. Nonetheless, the memory cell array 2 has a plurality of NAND cells arranged in the form of an array. The NAND cells arranged in the same column are connected to the same bit line BL. Data can be written altogether at a time, into the memory cell transistors MT connected to the same word line. The data unit so written is called "one page." The data can be erased altogether from the NAND cells. The data unit so erased is called "one block."

The row decoder 3 selects any row of the memory cell array 2, in accordance with the address input externally.

The voltage generation circuit 4 applies a voltage to the row decoder 3. The voltage generation circuit 4 includes a plurality of charge pump circuits 6. The charge pump circuits 6 are provided for the word lines WL and select gate lines SGD and SGS, in one-to-one relationship. The voltage generation circuit 4 applies the voltages generated by the charge pump circuits 6, as the above-mentioned voltages VPGM and VPASS, to the row decoder 3. Each charge pump circuit 6 has a plurality of capacitors C.

The control circuit 5 receives an address and/or a command from an external device, and controls the other circuits provided in the flash memory 1 in accordance with the address and/or command it has received. The control circuit 5 controls, for example, the voltage generation circuit 4, instructing the same to generate a voltage required.

Of the components of the flash memory 1, those other than the memory cell array 2, such as voltage generation circuit 4 and control circuit 5, will be called "peripheral circuits" in the present embodiment.

The positional relationship the memory cell array 2 has with the peripheral circuits, as seen in the cross section of the flash memory 1, will be explained with reference to FIG. 2. FIG. 2 is a sectional view of the flash memory 1, showing one region of the memory cell array 2 and one region of the peripheral circuits. The sectional view of FIG. 2 is taken along a line extending along the gates of MOS transistors. It should be noted, however, that all elements need not be so arranged as illustrated in FIG. 2.

As shown in FIG. 2, a p-type well region 12 is formed in the surface region of a semiconductor substrate (e.g., p-type silicon substrate) 10, in the memory cell array 2. P-type well region 12 is doped with, for example, boron. The impurity concentration of well region 12 is set at, for example, from $10^{14}$ cm$^{-3}$ to $10^{19}$ cm$^{-3}$. Two n-type well regions 50 are formed on both sides of well region 12, respectively. On one side of well region 12, an n-type well region 50 is formed. Beneath well region 12, an n-type well region 11 is formed, contacting well regions 12 and 50. N-type well regions 11 and 12 therefore surround p-type well region 12. Well region 12 is thus electrically isolated from the semiconductor substrate 10. Since well region 12 is electrically isolated from the semiconductor substrate 10, the potential of well region 12 can be controlled, in dependently of the semiconductor substrate 10, in accordance with the operating mode of the memory cell array 2. This double-well structure can serve to decrease the load on the charge pump circuits 6, ultimately reducing the power consumption of the flash memory 1.

Memory cell transistors MT are provided on well region 12. These memory cell transistors MT are isolated from one another along a word line, by isolation regions STI. The isolation regions STI have a depth of, for example, about 0.1 to about 0.5 μm. The isolation regions STI have been formed by burying, for example, silicon oxide film in the trenches made in the surface of the semiconductor substrate 10.

A potential must be uniformly applied to the entire well region 12, in order to accomplish uniform data erasure in the plurality of memory cell transistors MT. To achieve the uniform data erasure, the bottom of well region 12, i.e., interface between well region 12 and well region 11, is positioned far deeper than the bottoms of the isolation regions STI. The bottom of well region 12 lies at depth of, for example, 0.4 to 0.9 μm from the surface of the semiconductor substrate 10.

The NAND flash memory 1 uses the tunnel current flowing in a tunnel insulating film 13 to inject a charge into charge storage layers 14 and to release the charges from the charge storage layers 14.

Data is erased at a time at the memory cell transistors to increase the number of memory cells from which data can be erased per unit time. Thus, data can be erased from a plurality of memory cells at the same time. To erase the data, a positive voltage of 15 V or more is applied to well region 12, with respect to the semiconductor substrate 10. The charge is thereby transferred from the charge storage layers 14 into well region 12.

On the other hand, the voltage applied to diffusion layers 17 is lowered in order to read or write data, while maintaining the voltage of well region 12 at 0 V. The power for electrically charging or discharging well region 12 can be decreased, and the operating speed of the flash memory 1 rises. Further, in the NAND flash memory 1 according to this embodiment, data is erased or written by selectively connecting the output nodes of the charge pump circuit 6 to well region 12 or the control gate 16 (i.e., word line WL).

The structure of each NAND cell, as viewed in a cross section, will be described in detail, with reference to FIG. 3. FIG. 3 is a sectional view taken along the bit line.

As shown in FIG. 3, an n-type well region 11 is formed in the surface region of the p-type semiconductor substrate 10, and a p-type well region 12 is formed in the surface region of well region 11. On well region 12, a gate insulating film 13 is formed. The gate insulating film 13 has been formed by using a silicon oxide film or a silicon oxynitride film that has thickness ranging from 4 nm to 12 nm. The gate insulating film 13 functions as tunnel insulating film to the memory cell transistors.

On the gate insulating film 13, the gate electrodes of the memory cell transistors MT and select transistors ST1 and ST2 are formed.

The gate electrodes of the memory cell transistors MT and select transistors ST1 and ST2 have a charge storage layer 14 formed on the gate insulating film 13, an inter-gate insulating film 15 formed on the charge storage layer 14, and a conductive layer 16 formed on the inter-gate insulating film 15.

The charge storage layer 14 is, for example, either a polycrystalline silicon layer (i.e., conductive layer) or a silicon nitride layer.

The inter-gate insulating film 15 is, for example, a silicon oxide film, a silicon oxynitride film, an ON fill or NO film (each composed of silicon oxide film and silicon nitride film), or an ONO film, or a stacked gate structure including these. Alternatively, the inter-gate insulating film 15 may be an $Al_2O_3$ film, $HfSi_x$ film, $AlSi_x$ film, $HfO_x$ film or $TiO_x$ film. Still alternatively, the inter-gate insulating film 15 may be a multilayer film composed of at least one selected form the group consisting of $Al_2O_3$ film, $HfSi_x$ film, $AlSi_x$ film, $HfO_x$ film and $TiO_x$ film, a silicon oxide film, silicon nitride film, and a silicon oxynitride film.

The conductive layers 16 are conductive silicon layers, silicide layers, or two-layer layers composed of a silicon layer and a silicide layer. Examples of the silicide layers are WSi, NiSi, MoSi, TiSi and CoSi. Each conductive layer 16 connects any memory cell transistors that are adjacent in the direction at right angles to the bit lines BL, and functions as a word line WL.

In select transistors ST1 and ST2, one through hole is made in each inter-gate insulating film 15. The bottom of the conductive layer 16 contacts the upper surface of the charge storage layer 14. In select transistors ST1 and ST2, each conductive layer 16 connects any transistors that are adjacent along the word line extending direction. The conductive layer 16 functions as select gate line SGD or select gate line SGS.

In those parts of the surface region of the semiconductor substrate 10, which lie between the gate electrodes adjacent to one another, n-type impurity diffusion layers 17 are formed. Impurity diffusion layers 17 are provided for adjacent transistors. Each impurity diffusion layer 17 is used as the source (S) or drain (D) of a transistor. The diffusion layer 17 used as source or drain will be hereinafter called "source/drain diffusion layer 17." The source/drain diffusion layer 17 contains, for example, phosphorus, arsenic or antimony. Its surface concentration is $10^{17}$ cm$^{-3}$ to $10^{20}$ cm$^{-3}$. The region between the source and the drain functions as channel region, in which electrons move.

On the semiconductor substrate 10, an inter-layer insulating film 19 is formed, covering the memory cell transistors MT and select transistors ST1 and ST2. The inter-layer insulating film 19 is, for example, a silicon oxide film.

In the inter-layer insulating film 19, a contact plug CP1 is formed. Contact plug CP1 reaches impurity diffusion layer 17 (source S) of the select transistor ST1 on the source side. In the surface of the inter-layer insulating film 19, a metal interconnect layer 20 is formed. Metal interconnect layer 20 is connected to contact plug CP1. Metal interconnect layer 20 functions as source line SL.

In the inter-layer insulating film 19, a contact plug CP2 is formed. Contact plug CP2 reaches impurity diffusion layer 17 (drain D) of the select transistor ST2 on the drain side. In the surface of the inter-layer insulating film 19, a metal interconnect layer 21 is formed. Metal interconnect layer 21 is connected to contact plug CP2.

On the inter-layer insulating film 19, an inter-layer insulating film 22 is formed, covering metal interconnect layer 21. In the inter-layer insulating film 22, a contact plug CP3 is formed, reaching metal interconnect layer 21. On the inter-layer insulating film 22, a metal interconnect layer 23 is formed, which is connected to contact plug CP3. Metal interconnect layer 23 functions as it line BL.

As shown in FIG. 2, the elements constituting the peripheral circuits are formed on the semiconductor substrate 10, together with the memory cells, and are arranged adjacent to the memory cell array 2.

A MOS transistor Q1 having a breakdown voltage (high threshold voltage) higher than that of the memory cell transistors MT is arranged on the semiconductor substrate 10, adjacent to the memory cell array 2.

MOS transistor Q1 is incorporated in, for example, the row decoder 3 or the voltage generation circuit 4. As shown in FIG. 2, MOS transistor Q1 has a gate insulating film 42, which is thicker than the gate insulating film (tunnel insulating film) 13 of each memory cell transistor MT.

MOS transistor Q1 has a gate electrode 34 on the gate insulating film 42. The gate electrode 34 has a stacked gate structure essentially identical to that of the memory cell transistors. The gate electrode 34 of MOS transistor Q1 has a first conductive layer 43 formed on the gate insulating film 42, an inter-gate insulating film 44 formed on the first conductive layer 43, and a second conductive layer 45 formed on the inter-gate insulating film 44. A source/drain diffusion layer 32 is formed in a well region 51. The inter-gate insulating film 44 has a through hole. The bottom of the second conductive layer 45 contacts the top of the first conductive layer 43. MOS transistor Q1 has been formed, together with the memory cell transistors MT, practically in the same manufacturing step.

The flash memory 1 needs the voltage generation circuit 4 that generates a high voltage from a low voltage. The voltage generation circuit 4 is configured to generate a potential difference ranging from 10 to 15 V or more, with the potential of the semiconductor substrate 10 used as reference. This is why the voltage generation circuit 4 has voltage boosting circuits (e.g., charge pump circuits 6).

Each charge pump circuit 6 includes a plurality of capacitors C and a plurality of transistors. The capacitors C accumulate charges. The transistors control the charges accumulated in the respective capacitors. MOS transistors Q3 are shown in FIG. 2, which are incorporated in a charge pump circuit 6. Like MOS transistor Q1, MOS transistors Q3 have been formed, together with the memory cell transistors MT, practically in the same manufacturing step.

MOS transistors Q3 are high-breakdown voltage transistors, each having a gate insulating film 42 thicker than the gate insulating film of any memory cell transistor MT, and can therefore withstand potential differences of 15 V or more.

The gate electrode 34 of each MOS transistor Q3 has a first conductive layer 43 formed on the gate insulating film 42, an inter-gate insulating film 44 formed on the first conductive layer 43, and a second conductive layer 45 formed on the inter-gate insulating film 44. A source/drain diffusion layer 32 is formed in a well region 51.

In the inter-gate insulating film 44, a through hole is made. The bottom of the second conductive layer 45 contacts the top of the first conductive layer 43.

In addition to the high-breakdown voltage transistors Q1 and Q3, MOS transistors (hereinafter called "low-breakdown voltage MOS transistors) having a breakdown voltage lower than that of MOS transistors Q1 and Q3 are provided on the substrate 10, together with the memory cell transistors MT. The low-breakdown voltage MOS transistors have a stacked gate structure that is essentially identical to that of the high-breakdown voltage transistors Q1. The low-breakdown voltage MOS transistors have a gate insulating film thicker than the gate insulating film 13 of MOS transistors MT and thinner than the gate insulating film 42 of the high-breakdown voltage transistors Q1.

The capacitors C are formed on the isolation region (capacitor area) AA provided in the semiconductor substrate 10. Each capacitor C has an insulating film 42R having almost the same thickness as the gate insulating film 42, an electrode 34A having almost the same structure as the gate electrode 34, and an impurity diffusion layer 32A. The electrode 34A of the capacitor C is provided above well region 51 formed in the surface of the semiconductor substrate 10 (more precisely, capacitor area AA), with the insulating film 42A interposed between it and well region 51. As shown in FIG. 2, the capacitors C are provided p-type well region 51. Instead, they may be provided in that part of the p-type semiconductor substrate 10, in which no well regions are formed.

At the boundaries between the regions in which the memory cell array 2, MOS transistor Q1, MOS transistor Q3 and capacitors C are formed, respectively, isolation regions STI are formed. Beneath the isolation regions STI, well regions 36 having the same conductivity type (here, p type) as the semiconductor substrate 10 are formed as channel stoppers. Further, p-type regions 37 are formed to prevent a punch-through leakage current from flowing at the bottoms of the isolation regions STI. Well regions 36 serving as channel stoppers, and p-type regions 37 may not be formed in some cases.

An n-type well region (not shown) is formed, reaching the surface of the semiconductor substrate 10. This n-type well region is used as a region in which n-channel MOS transistors may be formed.

The basic configuration the capacitors, which are incorporated in the semiconductor device (e.g., flash memory) according to this embodiment, will be described with reference to FIG. 4, FIG. 5 and FIG. 6.

Figure 4:
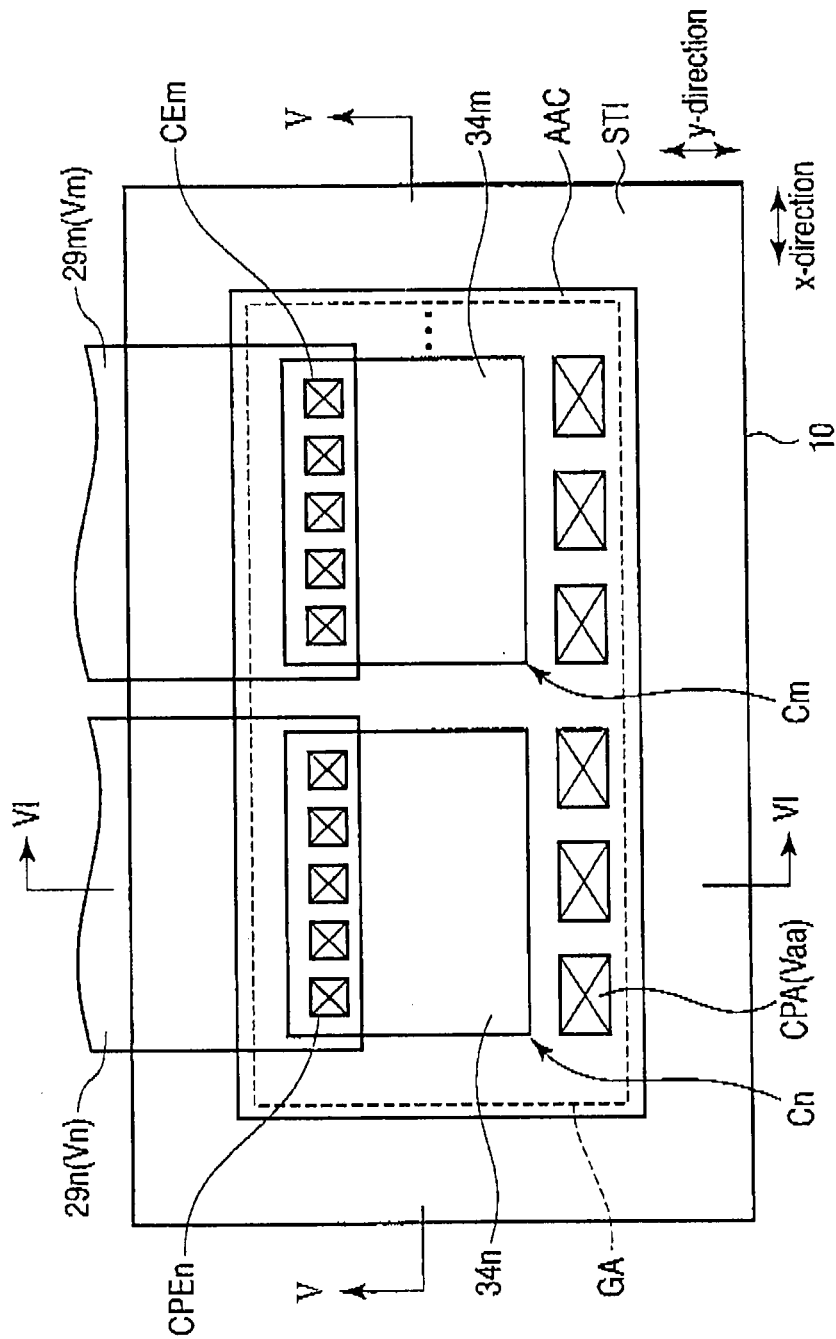
FIG. 4 is a plan view explaining the structure of a semiconductor device according to a first embodiment.

FIG. 4 is a plan view showing capacitors Cm and Cn included in the semiconductor device according to this embodiment. FIG. 5 is a sectional view taken along line V-V in FIG. 4, showing capacitors Cm and Cn. FIG. 6 is a sectional view taken along line VI-VI in FIG. 4, showing capacitors Cm and Cn, too. In FIG. 5, the broken lines indicate two members that exist in front and at the back of the plane of the cross section, respectively, in the depth direction of the drawing.

Figure 6:
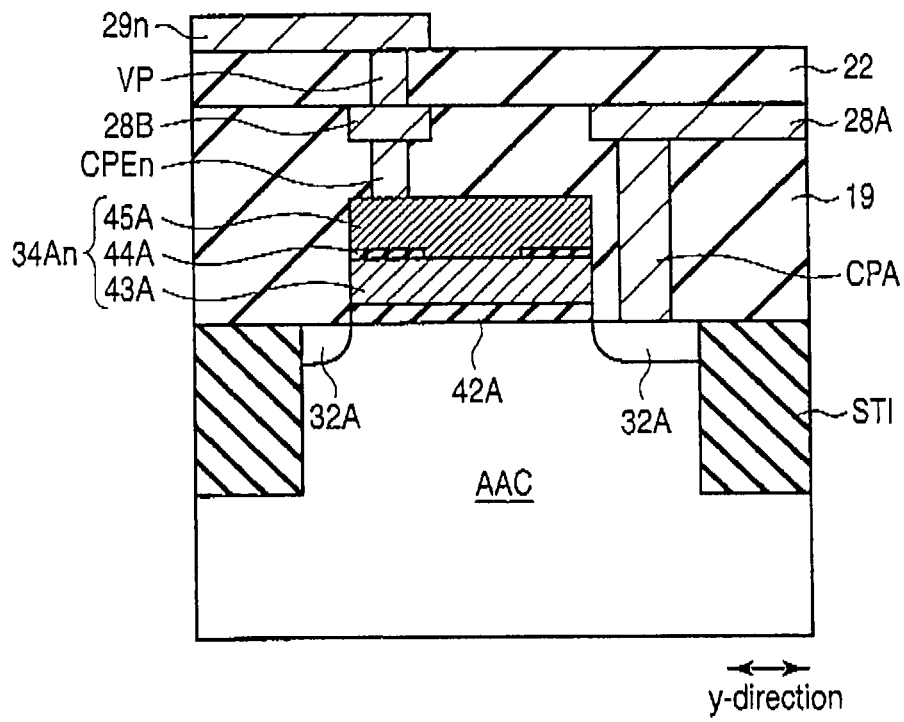
FIG. 6 is a sectional view explaining the structure of a semiconductor device according to a first embodiment.

As shown in FIG. 4 to FIG. 6, an isolation region STI is provided in the semiconductor substrate 10. In the isolation regions STI, an isolation insulating film is buried. The isolation region STI defines one semiconductor region (active region) AAC in the semiconductor substrate 10.

The semiconductor region AAC is a p- or n-type well region, or a semiconductor substrate (e.g., p-type silicon substrate) having no well regions.

In the semiconductor device according to this embodiment, at least two capacitors Cm and Cn are provided in one semiconductor region AAC. Capacitors Cm and Cn provided in the same semiconductor region AAC make one capacitor group GA. Hereinafter, the semiconductor region in which the capacitor group GA is provided may be called the "capacitor formation region (capacitor area)," on some occasions.

Capacitors Cm and Cn are MOS capacitors. Each of these capacitors Cm and Cn has a gate insulating film 42A provided on the surface of the semiconductor region AAC, and gate electrodes 34Am and 34An provided on the gate insulating film 42A. Hereinafter, the gate insulating film 42A used as a part of capacitors Cm and Cn will be called "capacitor insulating film 42A," and the gate electrodes gate electrodes 34Am and 34An used as elements constituting capacitors Cm and Cn will be called "capacitor electrodes 34Am and 34An." If the MOS capacitors Cm and Cn are formed on p-type well regions or on a p-type semiconductor substrate, channels are formed beneath capacitor electrodes 34An and 34Am when the MOS capacitors are driven (or when a positive voltage is applied to capacitor electrodes 34An and 34Am).

The capacitor insulating film 42A of the capacitor C is thicker than the gate insulating film (tunnel insulating film) of each memory cell transistor MT so that the capacitor C may withstand a potential difference of 15 V or more, which it may have with respect to the potential of the semiconductor region ARC. The capacitor insulating film 42A may be formed at the same as, for example, the gate insulating film 42 of MOS transistor Q3. In this case, the capacitor insulating film 42A has the same thickness as the gate insulating film 42 of MOS transistor Q3. The material of the capacitor insulating film 42A is identical to that of the gate insulating film 42. Nonetheless, the capacitor insulating film 42A may be formed in a step different from the step of forming the gate insulating film 42. Hence, the capacitor insulating film 42A may differ from the gate insulating film 42 in terms of thickness or material. Moreover, the capacitor insulating film 42A may have a stacked gate structure.

Capacitor electrode 34Am of capacitor Cm and capacitor electrode 34An of capacitor Cn are formed, practically at the same time as, for example, the stacked gate electrodes of the memory cell transistors MT is formed. Therefore, capacitor electrodes 34Am and 34An of capacitors Cm and Cn, respectively, have a conductive layer 43A, a conductive layer 45A, and an inter-gate insulating film 44A interposed between two conductive layers 43A and 45A. As in MOS transistor Q3, the inter-gate insulating film 44A has, for example, a through hole, and the bottom of the second conductive layer 45A contacts the top of the first conductive layer 43a via the through hole.

Capacitor electrodes 34Am and 34An are arranged adjacent to each other in one semiconductor region (capacitor formation region) AAC.

On capacitor electrodes 34Am and 34An, contact plugs CPEm and CPEn are provided, respectively. It suffices to provide at least one contact plug CPEm to be connected to one capacitor electrode 34Am, and at least one contact plug CPEn to be connected one capacitor electrode 34An.

Contact plug CPEm connects a metal interconnect layer 29m to capacitor electrode 34Am, and contact plug CPEn connects a metal interconnect layer 29n to capacitor electrode 34An. Metal interconnect layers 29m and 29n are electrically isolated from each other with respect to each capacitor Cm and Cn, respectively. The potentials of capacitor electrodes 34Am and 34An of capacitors Cm and Cn are therefore controlled, independently of each other. While the circuit including the capacitor group GA is operating, potentials Vm and Vn of different values are applied from metal interconnect layers 29m and 29n to capacitor electrodes 34Am and 34An, respectively.

The capacitor group GA has, for example, the one diffusion layer 32A surrounding the capacitor electrodes Cm and Cn. Impurity diffusion layer 32A is provided in the surface region of the semiconductor region AAC. Impurity diffusion layer 32A is formed in the semiconductor region (capacitor formation region) AAC, surrounding, for example, capacitor electrodes 34Am and 34An. Impurity diffusion layer 32A is continuous in the capacitor formation region AAC. Impurity diffusion layer 32A is shared by capacitors Cm and Cn in the semiconductor region AAC. Impurity diffusion layer 32A in the capacitor formation region AAC is provided to surround the capacitor electrodes Cm, Cn.

Impurity diffusion layer 32A has been formed at the same time as, for example, the source/drain diffusion layers 32 of transistors MT, Q1 and Q3. In this case, impurity diffusion layer 32A provided in the semiconductor region AAC has the same impurity concentration as, for example, the source/drain diffusion layers 32.

At least one contact plug CPA is provided on impurity diffusion layer 32A provided in the semiconductor region AAC. Through contact plug CPA, potential Vaa is applied to impurity diffusion layer 32A.

In this embodiment, potential Vaa applied to impurity diffusion layer 32A controls the potential level at the one end (i.e., substrate or well) of any capacitor (Cm or Cn) provided in one semiconductor region AAC. That is, channels are formed beneath capacitor electrodes 34An and 34Am when the MOS capacitors are driven, and the potential level at one end of capacitor Cm and the potential level at one end of capacitor Cn are commonly controlled through the these channels. The potential level at the other end (electrode) of capacitor Cm and the potential level at the other end (electrode) of capacitor Cn are independently controlled, by potentials Vm and Vn applied to metal interconnect layers 29A and 196 spaced apart from each other. To the semiconductor region AAC, ground potential (0 V) is applied in order to stabilize the operation of the semiconductor device.

Capacitors Cm and Cn, for example, are formed practically in the same manufacturing step, along with the memory cell transistors and the MOS transistors. Thus, capacitors Cm and On can be formed without increasing the number of manufacturing steps of the semiconductor device.

Capacitors Cm and Cn shown in FIG. 3 to FIG. 5 are used in, for example, the charge pump circuit 6.

As described above, a plurality of capacitors Cm and Cn are provided in the semiconductor region (capacitor area) AAC in the semiconductor device according to this embodiment. In the present embodiment, these capacitors Cm and Cn provided in the semiconductor region AAC are commonly controlled in term of the potential at the diffusion layer 32A that is used as one end of each capacitor.

The potential level of the diffusion layer 32A used as one end of each capacitor may be controlled to different values for the respective capacitor groups GA. In this case, the capacitor groups GA must be electrically isolated from one another, in order to stabilize the operation of the semiconductor device. To stabilize the operation of the device, each capacitor group GA is provided in one semiconductor region surrounded by an isolation region.

Moreover, when a capacitor (MOS capacitor) is driven, the channel formed beneath the capacitor electrode extends, in some cases, to the adjacent semiconductor region formed for another capacitor via the bottom of the isolation insulating film. This extension of channel may possibly cause the adjacent capacitors to malfunction, depending upon the state in which the adjacent capacitors are driven. In order to suppress such malfunction, the isolation regions are elongated in the adjacent capacitor formation regions, in the direction parallel to the surface of the semiconductor substrate. Furthermore, channel stoppers (well regions 36 and 37) are formed at the bottom of the isolation insulating film provided in the isolation region. In order to provide margins for forming the channel stoppers, the isolation region (isolation insulating film) inevitably has a still large size.

In the semiconductor device according to this embodiment, a plurality of capacitors Cm and Cn are provided in the same semiconductor region AAC. Formed in the same semiconductor region AAC, one ends of capacitors Cm and Cn are controlled by the same potential levels when a potential is applied to the semiconductor region AAC.

While capacitors Cm and Cn provided in one semiconductor region AAC are being driven, or while channels (inversion layers) are being formed beneath capacitor electrodes 34Am and 34An, the diffusion layer 32A, i.e., ends of capacitors Cm and Cn, are controlled through the channels at the same potential level. In the semiconductor region AAC, a channel is formed immediately below the capacitor insulating film 42A. Beneath this channel, a depletion layer is formed. Nonetheless, the capacitance of the depletion layer is negligibly small as compared with the capacitance of the gate insulating film 42A (i.e., capacitance of the capacitor composed of the capacitor electrodes 34A, gate insulating film 42A and the channel). As a result, the depletion will scarcely influence capacitors Cm and Cn, though capacitors Cm and Cn are arranged adjacent to each other, in one semiconductor region AAC.

Thus, neither capacitors Cm and Cn controlled by the same potential level at the one ends nor the capacitor group GA including these capacitors Cm and Cn is practically degraded though capacitors Cm and Cn are provided in the same semiconductor region AAC, in the semiconductor device according to this embodiment.

Note that capacitor electrodes of capacitors Cm and Cn formed in one semiconductor region RAC have their potentials controlled independently. Capacitor electrodes 34Am and 34An of capacitors Cm and Cn must, therefore, be electrically isolated. Nevertheless, the potential difference between capacitor electrodes 34Am and 34An can be adjusted to a relatively small value by adjusting the arrangement of capacitors Cm and Cn, though different potentials are applied to capacitor electrodes 34Am and 34An while capacitors Cm and Cn are being driven. In this embodiment, the potential difference between capacitor electrodes 34Am and 34An can be about 5 V at most if the distance (gap) between capacitor electrodes 34Am and 34An is set to, for example, about 0.2 to 1.0 µm. The distance between capacitor electrodes 34Am and 34An can indeed be rendered shorter than the width (e.g., about 2 to 5 µm) of the isolation region isolating adjacent two semiconductor regions AAC.

As specified already, a plurality of capacitors Cm and Cn can be provided in the same semiconductor region AAC, without degrading the operating characteristic of the semiconductor device and without the necessity of electrically isolating them by isolation regions, only if capacitors Cm and Cn can be commonly controlled in terms of potential level at one end (semiconductor region).

Hence, the area occupied by the isolation regions for electrically isolating the capacitors from one another can be reduced.

Thus, with the semiconductor device according to the first embodiment, it is possible to reduce the area for the regions in which capacitors are formed.

(b) Configuration of the Charge Pump Circuits in The Voltage Generation Circuit

Some cases where the capacitors provided in one semiconductor region ACC are used in any charge pump circuit 6 incorporated in the voltage generation circuit 4 will be explained with reference to FIG. 7, FIG. 8, FIG. 9, FIG. 10, FIG. 11A, FIG. 11B, FIG. 12A and FIG. 12B.

<Circuit Configuration>

Figure 7:
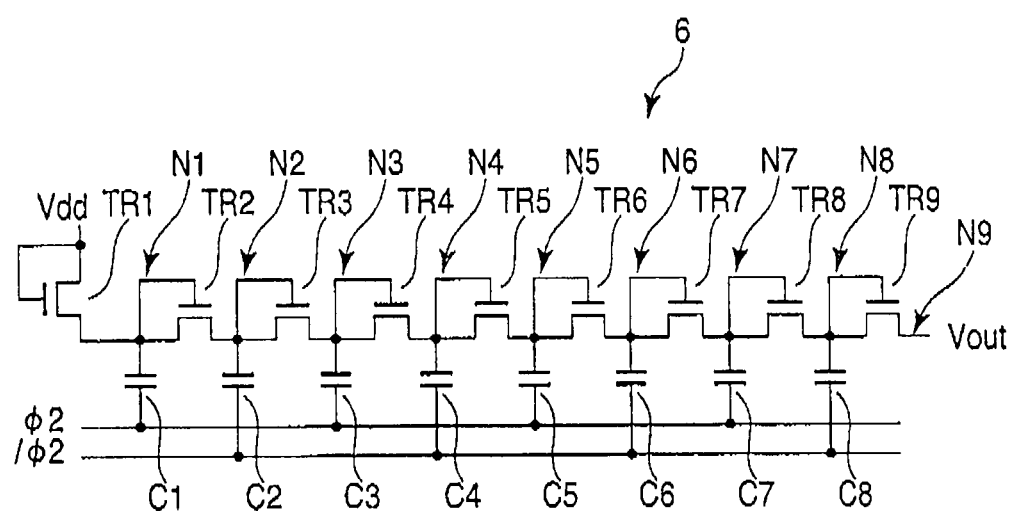
FIG. 7 is an equivalent circuit diagram showing an exemplary configuration of a charge pump circuit.

First, the configuration of each charge pump circuit 6 incorporated in the voltage generation circuit 4 will be described with reference to FIG. 7. FIG. 7 is an equivalent circuit diagram showing an exemplary configuration of the charge pump circuit 6.

As FIG. 7 shows, the charge pump circuit 6 has nine n-channel MOS transistors TR1 to TR9 and eight capacitors C1 to C8. The number of MOS transistors is not limited to nine. Nor is the number of capacitors limited to eight. The charge pump circuit 6 only needs to have at least three capacitors. In the following description, MOS transistors TR1 to TR9 and capacitors C1 to C8 will be called merely as "MOS transistors TR" and "capacitors C," respectively, unless they need to be distinguished from one another.

MOS transistor TR1 has its source or drain connected to its gate and also to the power-supply potential Vdd.

MOS transistor TR2 has one of its source and drain connected to its gate (hereinafter, the resultant connection node will be referred to as "node N1"). Further, the one of its source and drain is connected to the other of the source and drain of MOS transistor TR1.

MOS transistor TR3 has one of its source and drain connected to its gate (hereinafter, the resultant connection node will be referred to as "node N2"). Further, the one of its source and drain is connected to the other of the source and drain of MOS transistor TR2.

MOS transistor TR4 has one of its source and drain connected to its gate (hereinafter, the resultant connection node will be referred to as "node N3"). Further, the one of its source and drain is connected to the other of the source and drain of MOS transistor TR3.

MOS transistor TR5 has one of its source and drain connected to its gate (hereinafter, the resultant connection node will be referred to as "node N4"). Further, the one of its source and drain is connected to the other of the source and drain of MOS transistor TR4.

MOS transistor TR6 has one of its source and drain connected to its gate (hereinafter, the resultant connection node will be referred to as "node N5"). Further, the one of its source and drain is connected to the other of the source and drain of MOS transistor TR5.

MOS transistor TR7 has one of its source and drain connected to its gate (hereinafter, the resultant connection node will be referred to as "node N6"). Further, the one of its source and drain is connected to the other of the source and drain of MOS transistor TR6.

MOS transistor TR8 has one of its source and drain connected to its gate (hereinafter, the resultant connection node will be referred to as "node N7"). Further, the one of its source and drain is connected to the other of the source and drain of MOS transistor TR7.

MOS transistor TR9 has one of its source and drain connected to its gate (hereinafter, the resultant connection node will be referred to as "node N8"). Further, the one of its source and drain is connected to the other of the source and drain of MOS transistor TR8.

The other of the source and drain of MOS transistor TR9 (hereinafter referred to as "node N9") serves as output node for output voltage Vout of the charge pump circuit 6.

As specified above, each MOS transistor TR works as a rectification element, the anode of which is one of the source and drain of each MOS transistor TR and the cathode of which is the other of the source and drain. In other words, the MOS transistor TR incorporated in the charge pump circuit 6 is a diode-connected transistor.

Figure 8:
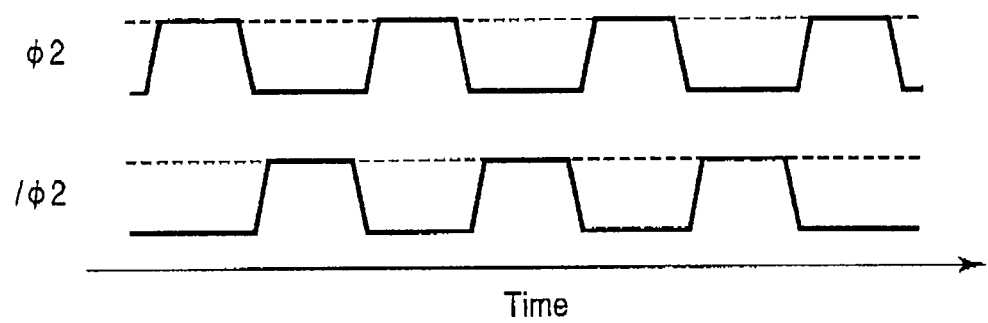
FIG. 8 is a waveform diagram showing control signals for the charge pump circuit.

Capacitors C1, C3, C5 and C7 are connected, at one electrode, to a signal line for a control (clock) signal Φ2. At the other electrode, capacitors C1, C3, C5 and C7 are connected to nodes N1, N3, N5 and N7, respectively. On the other hand, capacitors C2, C4, C6 and C8 are connected, at one electrode, to a signal line for a control (clock) signal /Φ2. At the other electrode, capacitors C2, C4, C6 and C8 are connected to nodes N2, N4, N6 and N8, respectively. As shown in FIG. 8, clock signal /Φ2 has been generated by inverting clock signal Φ2.

The charge pump circuit 6 includes a plurality of rectification elements connected in series. Clock signal Φ2 is supplied to the input nodes of the even-numbered rectification elements (i.e., MOS transistors TR2, TR4, TR6, . . . ) through the capacitors Cj (j=1, 3, 5, . . . ). Clock signal /Φ2 is supplied to the input nodes of the odd-numbered rectification elements, excluding MOS transistor TR1 (i.e., MOS transistors TR3, TR5, . . . ) through the capacitors C(j+1).

As shown in FIG. 8, clocks Φ2 and /Φ2 are clock signals that can assume voltage Vc and ground potential (GND). Clocks Φ2 and /Φ2, used as control signals, are two phase clock signals that never overlap in terms of generation timing of voltage Vcc, and therefore provide some time, for which any adjacent MOS transistors TR1 to TR9, serially connected can be disconnected from one another. This can prevent the charge from being applied backwards from node N9 toward node N1.

A voltage of 3 to 10 V is used as voltage Vcc, whereby the output voltage Vout can be a high voltage of 10 V or more. The output voltage Vout is used as, for example, voltage VPGM or voltage PASS. MOS transistors Tri have threshold voltages Vth1, Vth2, . . . , Vthi (i is an integer ranging from 1 to 9), respectively. The power-supply voltage Vdd is, for example, 1 to 5 V. In order to decrease the power-supply impedance, and to suppress changes in the output voltage, it is desired that the power-supply voltage Vdd for the charge pump circuit should be equal to the power-supply voltage of the NAND flash memory 1.

With regard to the charge pump circuit 6 shown in FIG. 7, the capacitors Cj (j=1, 3, 5, . . . ) to which clock Φ2 is input shall be called "odd-numbered capacitor group $G_{odd}$," and the capacitors $C(j+1)$ (j=1, 3, 5, ...) to which clock /Φ2 is input shall be called "even-numbered capacitor group $G_{even}$."

Figure 9:
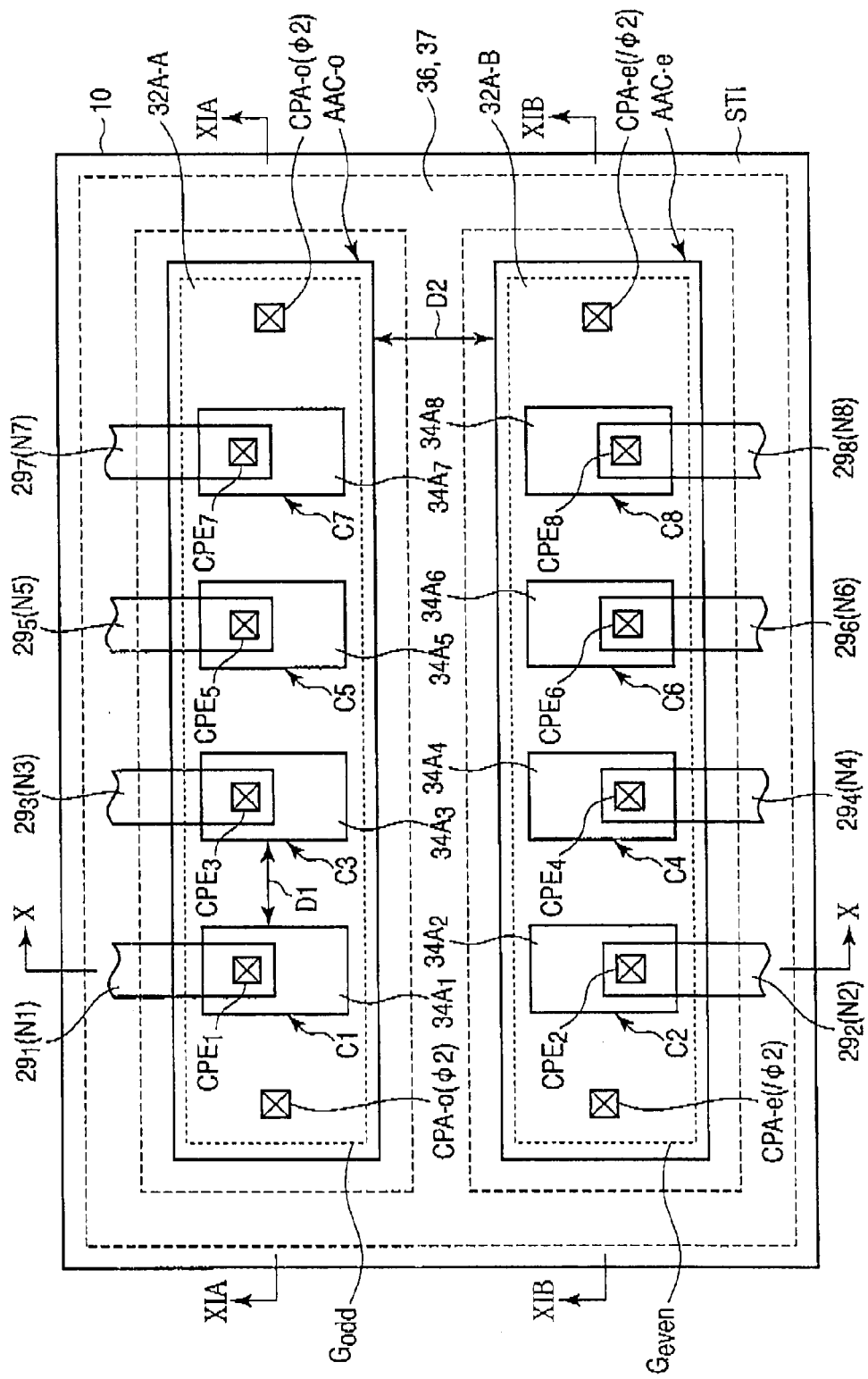
FIG. 9 is a plan view showing the layout of the capacitors in the charge pump circuit.

The structure of the capacitors incorporated in the charge pump circuit 6 of FIG. 7 will be described with reference to FIG. 9, FIG. 10, FIG. 11A and FIG. 11B. FIG. 9 is a plan view showing the layout of the capacitor formation regions (capacitor areas). FIG. 10 is a sectional view taken along line X-X shown in FIG. 9. FIG. 11A is a sectional view taken along line XIA-XIA shown in FIG. 9, and FIG. 11B is a sectional view taken along line XIB-XIB shown in FIG. 9. In FIG. 11A and FIG. 11B, the inter-layer insulating film is not illustrated. Further, neither the contact plugs nor the interconnect layers are shown in detail in FIG. 11A and FIG. 11B.

As shown in FIG. 9, FIG. 10, FIG. 11A and FIG. 11B, the odd-numbered capacitor group $G_{odd}$ and the even-numbered capacitor group $G_{even}$ are provided in, for example, semiconductor regions AAC-o and AAC-e of the semiconductor substrate (e.g., p-type silicon substrate) 10, respectively. In semiconductor regions AAC-o and AAC-e, p-type well regions 51p-e and 51p-o, for example, are provided. P-type well regions 51p-e and 51p-o may not be formed, as shown in FIGS. 5 and 6.

In semiconductor regions AAC-o and AAC-e, diffusion layers 32A-A and 32A-B are provided, surrounding capacitor electrodes $34A_1$, $34A_3$, $34A_5$ and $34A_7$ of the odd-numbered capacitor group $G_{odd}$ and capacitor electrodes $34A_2$, $34A_4$, $34A_6$ and $34A_8$ of the even-numbered capacitor group $G_{even}$, respectively. Diffusion layers 32A-A and 32A-B provided in semiconductor regions AAC-o and AAC-e are respectively shared by capacitors C1, C3, C5 and C7 of capacitor group $G_{odd}$ and capacitors C2, C4, C6 and C8 of capacitor group $G_{even}$. Diffusion layer 32A-A is continuous in semiconductor region AAC-o. Similarly, diffusion layer 32A-B is continuous in semiconductor region AAC-e.

Clocks Φ2 and /Φ2 are applied to the odd-numbered capacitor group $G_{odd}$ and the even-numbered capacitor group $G_{even}$ through contact plugs CPA-o and CPA-e provided in semiconductor regions AAC-o and AAC-e, respectively.

Clocks Φ2 and /Φ2 are control signals that rise to voltage Vcc at different times as shown in FIG. 8. Thus, the two well regions 51p-e and 51p-o are controlled at different times in terms of potential level. This is why two diffusion layers 32A-A and 32A-B are electrically isolated from each other, by the isolation region STI.

The odd-numbered capacitor group $G_{odd}$ (i.e., capacitors C1, C3, C5 and C7) is arranged in p-type well region 51p-o in which clock Φ2 is applied to diffusion layer 32A-A. The even-numbered capacitor group $G_{even}$ (i.e., capacitors C2, C4, C6 and C8) is arranged in p-type well region 51p-e in which clock /Φ2 is applied to diffusion layer 32A-B. The odd-numbered capacitor group $G_{odd}$ and even-numbered capacitor group $G_{even}$ are thus provided in semiconductor regions AAC-o and AAC-e (well regions), and electrically isolated from each other, respectively. The adjacent semiconductor regions AAC-o and AAC-e are spaced apart by the isolation insulating film embedded in the semiconductor substrate 10.

In the odd-numbered capacitor group $G_{odd}$, channels are formed beneath capacitor electrodes $34A_1$, $34A_3$, $34A_5$ and $34A_7$, respectively, when capacitors C1, C3, C5 and C7 are driven. In the even-numbered capacitor group $G_{even}$, channels are formed beneath capacitor electrodes $34A_2$, $34A_4$, $34A_6$ and $34A_8$, respectively, when capacitors C2, C4, C6 and C8 are driven.

As shown in the plan view of FIG. 9, diffusion layer 32A-A for capacitors C1, C3, C5 and C7 is continuous in the whole semiconductor region 51p-o, surrounding capacitor electrodes $34A_1$, $34A_3$, $34A_5$ and $34A_7$, respectively. Therefore, the diffusion layer 32A-A has a common potential, the one ends of capacitors C1, C3, C5 and 07 are commonly controlled to one another by diffusion layer 32A-A even if the odd-numbered capacitor group $G_{odd}$ is not driven. Similarly, diffusion layer 32A-B for capacitors C2, C4, C6 and C8 is continuous in the whole semiconductor region 51p-e, surrounding capacitor electrodes $34A_2$, $34A_4$, $34A_6$ and $34A_8$, respectively. The diffusion layer 32A-B has a common potential, the one ends of capacitors C2, C4, C6 and C8 are commonly controlled to one another by diffusion layer 32A-B even if the even-numbered capacitor group $G_{even}$ is not driven.

Diffusion layer 32A-A for capacitors C1, C3, C5 and C7 and diffusion layer 32A-B for capacitors C2, C4, C6 and C8 may not be continuous, respectively in semiconductor regions AAC-o and AAC-e. Instead, diffusion layer 32A-A may be divided into segments by capacitor electrodes $34A_1$, $34A_3$, $34A_5$ and $34A_7$, and diffusion layer 32A-B may be divided into segments by capacitor electrodes $34A_2$, $34A_4$, $34A_6$ and $34A_8$. This is because the segments of diffusion layer 32A-A are electrically connected together by the formed channels when capacitors C1, C3, C5 and C7 of the odd-numbered capacitor group $G_{odd}$ are driven, and the segments of diffusion layer 32A-B are electrically connected together by the formed channels when capacitors C2, C4, C6 and C8 of the even-numbered capacitor group $G_{even}$ are driven.

Contact plugs CPA-o and CPA-e are electrically connected to diffusion layers 32A-A and 32A-2, respectively, which are provided in p-type well regions 51p-o and 51p-e. Therefore, clock Φ2 is applied to capacitors C1, C3, C5 and C7 of the odd-numbered capacitor group $G_{odd}$, at one end, through contact plug CPA-o. Similarly, clock /Φ2 is applied to capacitors C2, C4, C6 and C8 of the even-numbered capacitor group $G_{even}$, at one end, through contact plug CPA-e.

As shown in FIG. 9, two contact plugs CPA-o are provided in semiconductor region AAC-o, respectively at two ends thereof. Similarly, two contact plugs CPA-e are provided in semiconductor region AAC-e, respectively at two ends thereof. The number and layout of contact plugs CPA-o provided in semiconductor region AAC-o is not limited to two. Nor are the number and layout of contact plugs CPA-e provided in semiconductor region AAC-e.

On capacitor electrode $34A_1$ of capacitor C1, a contact plug $CPE_1$ is provided. Contact plug $CPE_1$ is connected to a metal interconnect layer $29_1$ above diffusion layer 32A-A. Capacitor electrode $34A_1$ is connected to node N1 of transistor TR2 by metal interconnect layer $29_1$.

On capacitor electrode $34A_2$ of capacitor C2, a contact plug $CPE_2$ is provided. Contact plug $CPE_2$ is connected to a metal interconnect layer $29_2$ above diffusion layer 32A-B. Capacitor electrode $34A_2$ is connected to node N2 of transistor TR3 by metal interconnect layer $29_2$.

On capacitor electrode $34A_3$ of capacitor C3, a contact plug $CPE_3$ is provided. Contact plug $CPE_3$ is connected to a metal interconnect layer $29_3$ above diffusion layer 32A-B. Capacitor electrode $34A_3$ is connected to node N3 of transistor TR4 by metal interconnect layer $29_3$.

On capacitor electrode $34A_4$ of capacitor C4, a contact plug $CPE_4$ is provided. Contact plug $CPE_4$ is connected to a metal interconnect layer $29_4$ above diffusion layer 32A-B. Capacitor electrode $34A_4$ is connected to node N4 of transistor TR5 by metal interconnect layer $29_4$.

On capacitor electrode $34A_5$ of capacitor C5, a contact plug $CPE_5$ is provided. Contact plug $CPE_5$ is connected to a metal interconnect layer $29_5$ above diffusion layer 32A-B. Capacitor electrode $34A_5$ is connected to node N5 of transistor TR6 by metal interconnect layer $29_5$.

On capacitor electrode $34A_6$ of capacitor C6, a contact plug $CPE_6$ is provided. Contact plug $CPE_6$ is connected to a metal interconnect layer $29_6$ above diffusion layer 32A-B. Capacitor electrode $34A_6$ is connected to node N6 of transistor TR7 by metal interconnect layer $29_6$.

On capacitor electrode $34A_7$ of capacitor C7, a contact plug $CPE_7$ is provided. Contact plug $CPE_7$ is connected to a metal interconnect layer $29_7$ above diffusion layer 32A-B. Capacitor electrode $34A_7$ is connected to node N7 of transistor TR8 by metal interconnect layer $29_7$.

On capacitor electrode $34A_8$ of capacitor C8, a contact plug $CPE_8$ is provided. Contact plug $CPE_8$ is connected to a metal line layer $29_8$ above diffusion layer 32A-B. Capacitor electrode $34A_8$ is connected to node N8 of transistor TR9 by metal interconnect layer $29_8$.

Capacitors C1 to C8 are so connected, at the other end, to nodes N1 to N8 of transistors TR2 to TR9, respectively.

Metal interconnect layers $29_1$ to $29_8$, which are connected to capacitor electrode electrodes $34A_1$ to $34A_8$, are electrically isolated from one another. Capacitor electrode electrodes $34A_1$ to $34A_8$, of capacitors C1 to C8 are connected to nodes N1 to N8 of different transistors TR2 to TR9, respectively.

As will be described later, nodes N1 to N8 of transistors TR2 to TR9 have different potential levels, each level raised by the transistor immediately preceding the transistor having the node. That is, of any adjacent two nodes, the node nearer to the output side (i.e., transistor TR9) has a higher voltage (potential) than the other node. Hence, different potentials $V_1$ to $V_8$ are applied to capacitor electrodes $34A_1$ to $34A_8$ through metal interconnect layers $29_1$ to $29_8$ that are electrically isolated from one another. Of potentials $V_1$ to $V_8$ applied to capacitor electrode $34A_1$ to $34A_8$, each is higher than the one applied to the immediately preceding capacitor electrode.

While potentials $V_1$ to $V_g$ are applied to nodes N1 to N8 to which capacitors C1 to C8 are connected, channels 90 are formed in p-type well regions 51p-o and 51p-e that lie beneath capacitor electrodes $34A_1$ to $34A_8$.

In the odd-numbered capacitor group $G_{odd}$ and even-numbered capacitor group $G_{even}$, the interval (first distance) D1 at which capacitor electrodes $34A_1$ to $34A_8$ are arranged is smaller than the width (second distance) D2 of the isolation region STI.

At the bottom of the isolation region STI, channel stoppers 36 and 37 are provided. The channel stoppers 36 and 37 prevent a channel being formed between semiconductor regions AAC-o and AAC-e which are applied with clocks Φ2 and /Φ2, respectively, through the bottom of the isolation region STI.

<Operation>

How the charge pump circuit 6 operates will be explained with reference to FIG. 7, FIG. 8, FIG. 9, FIG. 10, FIG. 11A, FIG. 11B, FIG. 12A and FIG. 12B. FIG. 11A, FIG. 11S, FIG. 12A and FIG. 12B are sectional view schematically showing the states that capacitors C1 to C8 take while the charge pump circuit 6 is operating.

Assume that clock Φ2 is at ground potential GND (e.g., 0 V) and MOS transistor TR2 is in non-conductive state. Capacitors C1 to C8 take the state shown in FIG. 11A and FIG. 11B. If MOS transistor TR1 is rendered conductive in this state, node N1 is charged to a voltage that the threshold voltage Vth1 of MOS transistor TR1 is reduced from the power-supply voltage Vdd, that is, (Vdd−Vth1). At this point, the potential of node N1 (Vdd−Vth1=$V_1$) is applied to capacitor electrode $34A_1$, and 0 V is applied to diffusion layer 32A-A. As a result, a channel 90 is formed as shown in FIG. 11A, beneath capacitor electrode $34A_1$ of capacitor C1 at the first stage (odd-numbered stage).

Clock Φ2 is raised from GND to Vcc (e.g., 4 V). That is, the potential level of well regions 51p-o is changed from 0 to 4 V. Clock Φ2 is a signal for controlling the potential level at one end of each of capacitors C1, C3, C5 and C7 of the odd-numbered capacitor group $G_{odd}$. In the charge pump circuit of this embodiment, capacitors C1, C3, C5 and C7 of the odd-numbered capacitor group $G_{odd}$ share diffusion layer 32A-A. Capacitors C1, C3, C5 and C7 are therefore applied, at one end, with voltage of 4 V.

The capacitive coupling resulting from the Vcc application raises potential $V_1$ of node N1 by αVcc (up to about 4 V). As a result, potential $V_1$ of node N1 increases to (Vdd−Vth1+αVcc) at most. The amplitude of the voltage at node N1 decreases to, for example, αVcc because the capacitance ratio between capacitor C1 and MOS transistors TR1 and TR2. Note that α is a value equivalent to boost-up ratio and ranges, for example, from 0.7 to 1.

Also in this period, the channel 90 is formed beneath capacitor electrode $34A_1$ of capacitor C1 of the odd-numbered capacitor group $G_{odd}$. As the channel 90 is formed, a depletion layer is formed in well region (semiconductor region) 51p-o, at a position below capacitor electrode $34A_1$ of capacitor C1 (i.e., in the region beneath the channel 90). The serial capacitance defined by the capacitance of the depletion layer and the capacitance of the oxide film will not degrade the characteristic (e.g., electrostatic capacitance) of capacitor C1.

The odd-numbered capacitor group $G_{odd}$ and the even-numbered capacitor group $G_{even}$ are electrically isolated from each other. Therefore, the depletion layer of capacitor C1 imposes no adverse influence on capacitors C2, C4, C6 and 08 of the even-numbered capacitor group $G_{even}$.

As clock Φ2 rises from GND to Vcc, clock /Φ2 does fall from Vcc to GND. The potential level of well region 51p-o in which the even-numbered capacitor group $G_{even}$ is provided falls from 4 to 0 V. While potential $V_2$ of node N1 is rising, 0 V is applied to one end of each of capacitors C2, C4, C6 and C8 of the even-numbered capacitor group $G_{even}$.

While the charge pump circuit is being driven, the depletion layer of capacitor C1 may impose adverse influence on capacitors C2, C4, C6 and C8 of the even-numbered capacitor group $G_{ever}$, (or on the potential of well region 51p-o). Assume that the odd-numbered capacitor group $G_{odd}$ and the even-numbered capacitor group $G_{even}$, are electrically isolated by an impurity region (e.g., high-concentration p-type impurity layer), without use of the isolation insulating film. Then, the ground potential is applied to the high-concentration p-type impurity layer. Inevitably, a leakage current will be generated due to punch-through caused by the potential difference between diffusion layer 32A-A, 32A-B and the impurity layer. Furthermore, the high-concentration p-type impurity layer suppresses the formation of channels in the MOS capacitors. Consequently, the charge pump circuit 6 may fail to perform the prescribed operation. In view of this, the electrical isolation of the well regions (i.e., diffusion layers 32A-A and 32A-B, in which the odd-numbered capacitor group $G_{odd}$ and even-numbered capacitor group $G_{even}$ are provided), should better be electrically isolated by the isolation region STI, not by an impurity region such as a high-concentration p-type impurity layer.

While clock Φ2 remains at Vcc, MOS transistor TR2 remains conductive. Since clock /Φ2 is set to GND, 0 V is applied to one end of capacitor C2 (at even-numbered stage), next to capacitor C1 (at odd-numbered stage). In this case, capacitor C1 at an odd-numbered stage is at high potential, whereas capacitor C2 at an even-numbered stage is at low potential. A charge therefore moves between these capacitors C1 and C2 via MOS transistor TR2 now in conductive state. As a result, potential $V_1$ of node N1 is transferred to node N2 until potential $V_2$ of node N2 rises to {(potential $V_1$ of node N1)–Vth2}. Potential $V_2$ of node N2 further rises to almost {{Vdd–Vth1+ΔVcc}–Vth2}. In capacitor C2 connected to node N2, a potential {{Vdd–Vth1+ΔVcc}–Vth2} is applied to capacitor electrode $34A_2$. Thus, potential $V_2$ of node N2 forms a channel 90 beneath capacitor electrode $34A_2$, as shown in FIG. 11B.

Figures 12A, 12B:
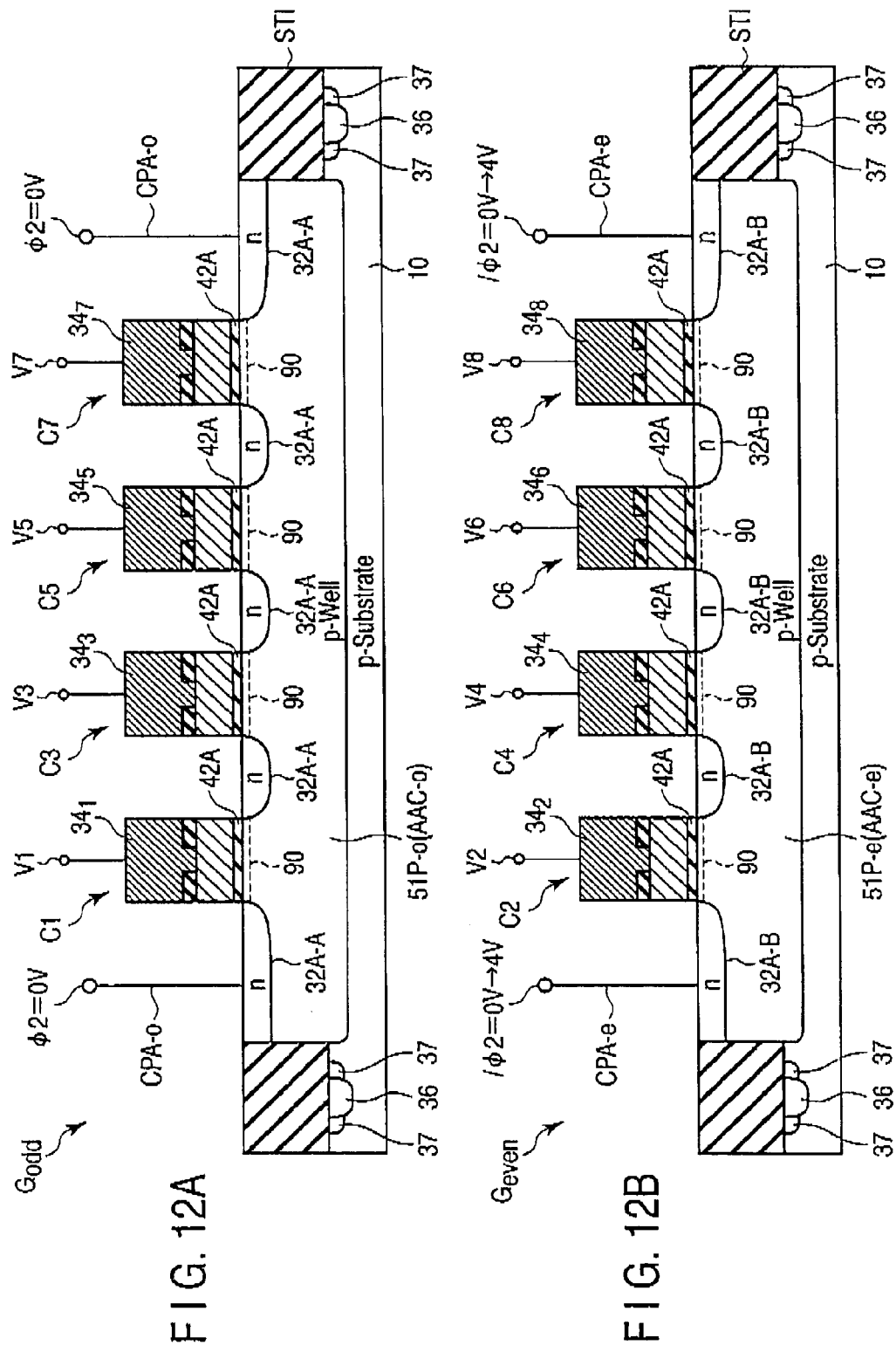
FIG. 12A and FIG. 12B are other diagrams explaining the structure and operation of the capacitors in the charge pump circuit.

Next, as shown in FIG. 12A and FIG. 12B, clock Φ2 is set to GND, rendering MOS transistor TR2 non-conductive. Clock /Φ2 rises from GND (0 V) to Vcc (4 V). At this point, diffusion layers 32A-A of the odd-numbered capacitor group $G_{odd}$ have their potential level lowered to 0 V, whereas diffusion layers 32A-B of the even-numbered capacitor group $G_{even}$ have their potential level raised from 0 to 4 V.

As node N1 does, node N2 has its potential $V_2$ raised by αVcc because of the capacitive coupling of capacitor C2. Potential $V_2$ of node N2 therefore rises to almost {Vdd–Vth1+αVcc}–Vth2}+αVcc.

As described above, the isolation region STI electrically isolates the odd-numbered capacitor group $G_{odd}$ and the even-numbered capacitor group $G_{even}$. Therefore, the depletion layer of capacitor Φ2 will not impose adverse influence on capacitors C1, C3, C5 and C7 of the odd-numbered capacitor group $G_{odd}$.

While clock /Φ2 remains at 4 V, MOS transistor TR3 becomes conductive, and clock Φ2 remains at 0 V. Hence, 0 V is applied to capacitors C1, C3, C5 and C7 of the odd-numbered capacitor group $G_{odd}$, at one end (i.e., well region 51p-o). As a charge moves between capacitors C2 and C3 via transistor TR3, potential $V_2$ of node N2 is transferred to node N3 until potential $V_3$ of node N3 rises to {(potential of note N2)–Vth3}. In the capacitor C3 connected to node N3, potential V3 of node N3 is applied to capacitor electrode $34A_4$. Thus, a channel 90 is formed beneath capacitor electrode $34A_3$, of capacitor C3, in accordance with the magnitude of potential $V_3$ of node N3.

The charge is repeatedly transferred in the same way as described above, alternately in the odd-numbered capacitor groups $G_{odd}$ and $G_{even}$. The potential is thereby raised at any other nodes, up to node N9.

More precisely, while clock /Φ2 is at Vcc, MOS transistors TR1, TR3, TR5, TR7 and TR9 at the odd-numbered stages become conductive, whereas MOS transistors TR2, TR4 TR6 and TR8 at the even-numbered stages become non-conductive.

Currents therefore flow from the node at power-supply potential Vdd to node N1, from node N2 to node N3, from node N4 to node N5, from node N6 to node N7, and from node N8 to node N9. The charge is thereby transferred.

While clock Φ2 is at Vcc, the even-numbered MOS transistors TR2, TR4, TR6 and TR8 become conductive, whereas the odd-numbered TR1, TR3 TR5, TR7 and TR9 become non-conductive. In this case, currents flow from node N1 to node N2, from node N3 to node N4, from node N5 to node N6, and from node N7 to node N8. The charge is thereby transferred.

A capacitive load, such as a word line, may be connected to node N9. If so, the output voltage Vout is smoothed by the capacitance of the load.

As long as the charge pump circuit 6 is operating, each of nodes N1 to N8 remains at a higher potential than the immediately preceding node. Different potentials are therefore applied to capacitor electrodes $34A_1$ to $34A_8$ through metal interconnect layers $29_1$ to $29_8$ that are electrically isolated from one another.

The charge pump circuit 6 of FIG. 7 needs a plurality of capacitors C1 to C9 in order to raise the any voltage (e.g., Vdd) to the drive voltage (e.g., 20 V or more) for the memory cell array.

In the semiconductor device according to this embodiment, a plurality of capacitors (MOS capacitors) are provided in a common semiconductor region (well region), not electrically isolated by isolation regions, while semiconductor regions (well regions) 51p-o and 51p-e are commonly controlled in terms of potential level. Therefore, the area the isolation regions occupy are reduced, the area capacitors C1 to C8 occupy and the area the circuit 6 having these capacitors occupies can be smaller than in the case where such isolation regions are provided for every capacitor. Although capacitors C1 to C8 are provided in semiconductor regions 51p-o 51p-e, they are scarcely degraded in operating characteristic, because each of the capacitor groups $G_{odd}$ and $G_{even}$ is commonly controlled in terms of the potential level of semiconductor regions 51p-o and 51p-e as a common one ends of capacitors.

In the charge pump circuit, nodes N1 to N8 are applied with different voltages such that each node is applied with a lower voltage than the node in the immediately higher stage. The voltage difference between any adjacent two nodes is relatively small, nevertheless. In capacitors C1 to C8 arranged in a common semiconductor region, two capacitors having a small potential difference are adjacently arranged in the common semiconductor region. Thus suppresses the dielectric breakdown of the inter-layer insulating film between the capacitor electrodes or the mutual interference of the capacitor electrodes, without increasing the distance between the capacitor electrodes. This can reduce the area of the region in which the capacitors are formed.

Capacitors C1 and C3, for example, are arranged adjacent to each other as shown in FIG. 9. Capacitor electrodes $34A_1$ and $34A_3$ are therefore located adjacent to each other. Since capacitor electrodes $34A_1$ and $34A_3$ have a relatively small potential difference, the distance between them can be short.

Any two capacitors isolated by an isolation region should better be connected to adjacent two nodes. As a result, the potential difference between the two interconnects connected to the electrodes of either capacitor become small, ultimately decreasing the leakage between the interconnects.

As has been described, the area the capacitors occupy can be reduced in the semiconductor device according to the first embodiment.

(2) Second Embodiment

A semiconductor device (e.g., flash memory) according to a second embodiment will be described with reference to FIG. 13A and FIG. 13B. FIG. 13A and FIG. 13B schematically show the sectional structure of a semiconductor device according to the second embodiment.

In the semiconductor device according to the first embodiment, the semiconductor region in which a plurality of capacitors are provided is a p-type well region or a p-type semiconductor substrate.

In the second embodiment, a plurality of capacitors C1 to C8 may be provided in an n-type well region 51n-o and 51n-e.

Capacitors C1, C3, C5 and C7 are provided in n-type well region 51n-o. The potential at one end (diffusion layer 32A-

A) of each of these capacitors C1, C3, C5 and C7 is controlled by a common potential level (control signal) Φ2.

Similarly, capacitors C2, C4, C6 and C8 are provided in n-type well region 51n-e. The potential at one end (diffusion layer 32A-B) of each of these capacitors C2, C4, C6 and C8 is controlled by a common potential level (control signal) /Φ2.

Thus, capacitors C1, C3, C5 and C76 provided in n-type well region 51n-o are controlled, at one end, by a common potential level, and capacitors C2, C4, C6 and C8 provided in n-type well region 51n-e are controlled, at one end, by a common potential level. Therefore, the area occupied by the regions in which the capacitors are provided can be reduced as in the first embodiment.

If capacitors C1 to C8 are provided on a p-type well region or a p-type substrate, the capacitance of the depletion layers will be formed as channels (inversion layers) are formed beneath the capacitor electrodes 34, as has been described above.

In this embodiment, channels need not be formed beneath capacitor electrodes $34A_1$, $34A_3$, $34A_5$ and $34A_7$, respectively, when the odd-numbered capacitors C1, C3, C5 and C7 are driven, as long as these capacitors, which are formed in n-type well region 51n-o, are controlled by a common potential level. Similarly, channels need not be formed beneath capacitor electrodes $34A_2$, $34A_4$, $34A_6$ and $34A_8$, respectively, when the even-numbered capacitors C2, C4, C6 and C8 are driven, as long as these capacitors, which are formed in n-type well region 51n-e, are controlled by a common potential level. Capacitors C1 to C8 are formed by n-type well as a electrode, capacitor electrode 34A, and capacitor insulating film 42A.

Hence, the charge pump circuit can be prevented from being degraded in operating characteristic, because capacitors C1 to C8 are formed in n-type regions 51n-o and 51n-e, the capacitance of depletion layers is not formed at all.

If capacitors C1 to C8 are formed on n-type well regions 51n-o and 51n-e as described above, channels need not be formed beneath capacitor electrodes $34A_1$ to $34A_8$. Therefore, diffusion layers 32A-A and 32A-B may not be formed in n-type well regions 51n-o and 51n-e to surround capacitor electrodes $34A_1$ to $34A_8$. It is desired, however, that the diffusion layers should be provided at the junctions between contact plugs CPA-o and CPA-e and well regions 51n-o and 51n-e, in order to decrease the contact resistance between contact plugs CPA-o and CFA-e and well regions 51n-o and 51n-e.

As shown in FIG. 13A and FIG. 13B, both the odd-numbered capacitor groups $G_{odd}$ and even-numbered capacitor group $G_{even}$ are provided in the n-type well region. Nonetheless, one of the capacitor groups may be provided in the n-type well region, and the other capacitor group may be provided in a p-type well region.

As has been described, the area occupied by the region in which the capacitors are provided can be reduced in the semiconductor device according to the second embodiment, in the same manner as in the first embodiment. In addition, the capacitors and the circuit using them can be improved in their operating characteristic.

(3) Third Embodiment

A semiconductor device according to a third embodiment will be described with reference to FIG. 14, FIG. 15, FIG. 16, and FIGS. 17A to 17C. In this embodiment, the clocks input to the charge pump circuit are three phase clocks. The features that distinguish this embodiment from the first and second embodiments will be described in the main.

Figure 14:
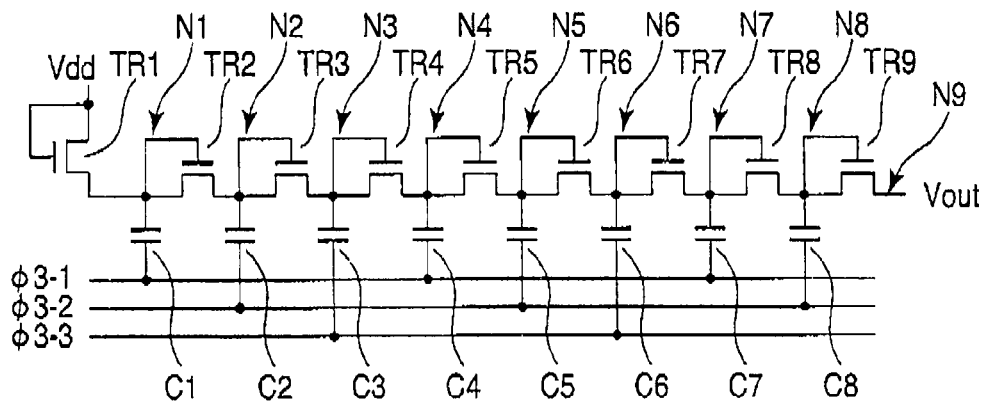
FIG. 14 is an equivalent circuit diagram showing an exemplary configuration of a charge pump circuit in a third embodiment.

FIG. 14 is an equivalent circuit diagram of the charge pump circuit of the third embodiment.

As FIG. 14 shows, the charge pump circuit 6 of this embodiment receives a clock Φ3-1 at one end (semiconductor region) of each of three capacitors Cj connected to nodes Nj (j=1, 4 and 7). Further, a clock Φ3-2 is input to one end (semiconductor region) of each of three capacitors C(j+1) connected to nodes Nj+1. Still further, a clock Φ3-3 is input to one end (semiconductor region) of each of three capacitors C(j+2) connected to nodes Nj+2.

Figure 15:
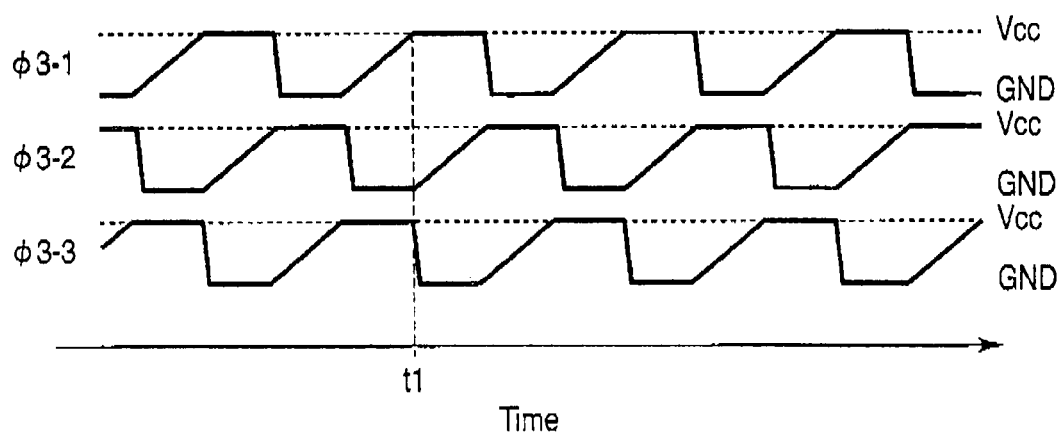
FIG. 15 is a waveform diagram showing control signals for the charge pump circuit.

FIG. 15 shows the waveforms of the control signals (clocks) used in the charge pump circuit 6. As can be seen from FIG. 15, clocks Φ3-1, Φ3-2 and Φ3-3 have waveforms shifted in phase with respect to one another by, for example, 120°. Each clock has a leading edge having a smaller slope (through rate) than the trailing edge. In other words, clocks Φ3-1, Φ3-2 and Φ3-3 rise more slowly than they fall.

Figure 17A:
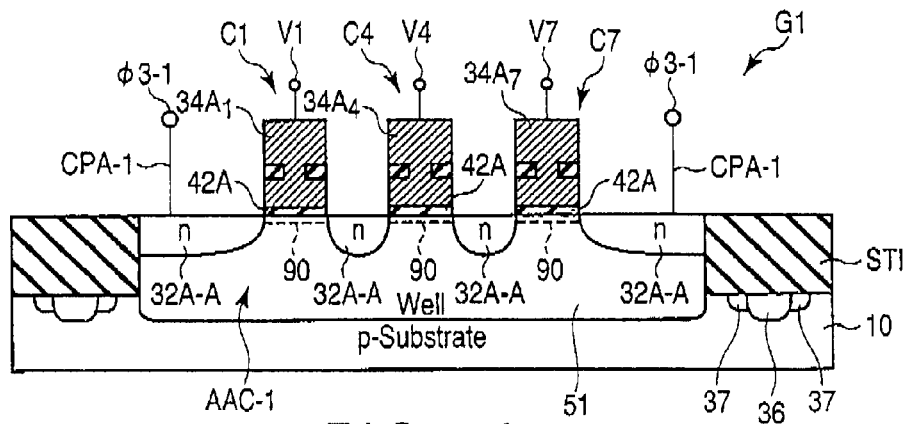
FIG. 17A, FIG. 17B and FIG. 17C are diagrams explaining the structure of the capacitors in the charge pump circuit.
Figure 17B:
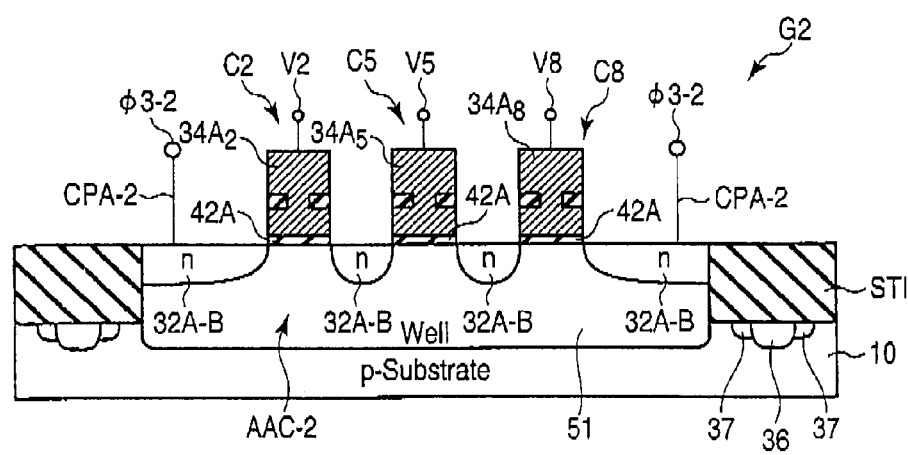
Figure 17C:
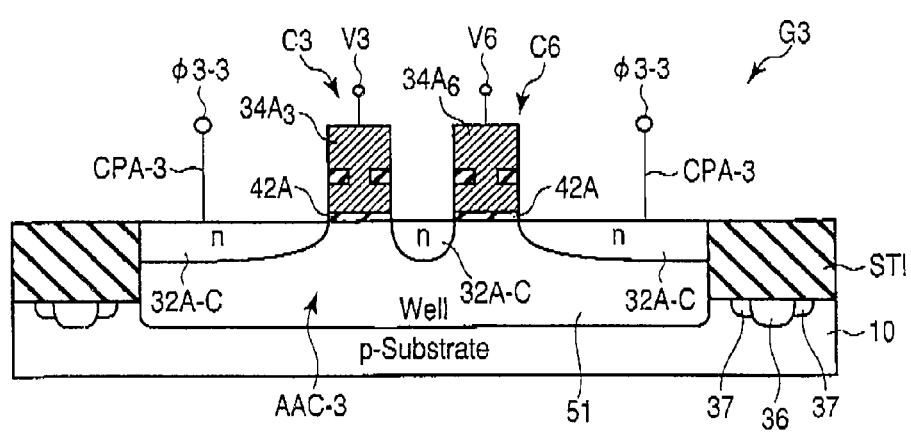

The charge pump circuit of the third embodiment has a plurality of capacitors C1 to C8. The structure of capacitors C1 to C8 will be described, with reference to FIG. 16 and FIGS. 17A to 17C. FIG. 16 is a plan view showing the layout of capacitors C1 to C8 incorporated in the charge pump circuit 6. FIG. 17A, FIG. 17B and FIG. 17C are sectional views of three capacitor formation regions AAC-1, AAC-2 and AAC-3, respectively.

As shown in FIG. 16, three semiconductor regions AAC-1, AAC-2 and AAC-3 are provided in the surface region of a semiconductor substrate 10, in association with clocks Φ3-1, Φ3-2 and Φ3-3 that are shifted in phase with respect to one another. Semiconductor regions AAC-1, AAC-2 and AAC-3 are surrounded by isolation regions STI, respectively, and are electrically isolated from one another by the isolation regions STI. On semiconductor region AAC-1, a capacitor group G1 is provided. On semiconductor region AAC-2, a capacitor group G2 is provided. On semiconductor region AAC-3, a capacitor group G3 is provided.

As FIG. 16 and FIGS. 17A to 17C show, clock Φ3-1 is applied to a diffusion layer 32A-A provided in semiconductor region AAC-1, through a contact plug CPA-1. Clock Φ3-2 is applied to a diffusion layer 32A-B provided in semiconductor region AAC-2, through a contact plug CPA-2. Similarly, clock Φ3-3 is applied to a diffusion layer 32A-C provided in semiconductor region AAC-3, through a contact plug CPA-3. Therefore, clocks (potentials) Φ3-1, Φ3-2 and Φ3-3 are applied, respectively to capacitor groups G1, G2 and G3, respectively, more precisely to one end of each capacitor.

As can be seen from FIG. 16 and FIGS. 17A to 17C, capacitor group G1 to which clock Φ3-1 is input includes three capacitors C1, C4 and C7. Capacitors C1, C4 and C7 of the group G1 are provided in one semiconductor region AAC-1. The three capacitors C1, C4 and C7 therefore receive clock Φ3-1 at one end (diffusion layer 32A-A).

Capacitor group G2 to which clock Φ3-2 is input includes three capacitors C2, C5 and C8. Capacitors C2, C5 and C8 of the group G2 are provided in one semiconductor region AAC-2. These three capacitors C2, C5 and C8 therefore receive clock Φ3-2 at one end (diffusion layer 32A-13).

Capacitor group G3 to which clock Φ3-3 is input includes two capacitors C3 and C6. Capacitors C3 and C6 of the group G3 are provided in one semiconductor region AAC-3. The two capacitors C3 and C6 therefore receive clock Φ3-3 at one end (diffusion layer 32A-C).

In this embodiment, capacitors C1 to C8 are divided into three groups, which are provided in three semiconductor regions AAC-1, AAC-2 and AAC-3, respectively, and the capacitors of each group are provided on the same semiconductor region to which a common clock (control signal) is applied.

The layout of the three semiconductor regions AAC-1, AAC-2 and AAC-3 is not limited to the layout of FIG. 16. Moreover, well regions 51-1, 51-2 and 51-3 shown in FIG. 16 and FIGS. 17A to 17C, in which capacitor groups G1 to G3 are provided, respectively, may be p-type well regions or n-type well regions. Furthermore, capacitor groups G1 to G3 may be provided in a semiconductor region (e.g., p-type semiconductor region) in which no well regions are provided.

The charge pump circuit which receives three phase clocks operates in principle essentially identical to that of the charge pump circuit driven by the above-mentioned two phase clocks. That is, as the three clock signals Φ3-1 to Φ3-3 change in potential level in the charge pump circuit, the potential of each of nodes N1 to N8 rises above the value at the immediately preceding node because of the capacitive coupling of capacitors C1 to C8. The voltages, each so raised, are sequentially transferred to the next stage nodes N2 to N9 through transistors TR2 to TR9, respectively.

Since the three clocks are used as shown in FIG. 16, the charge can be efficiently transferred even if MOS transistors of a large reverse current are used as rectification elements. This is because, as shown in FIG. 16, clock Φ3-1 is raised to Vcc at time t1 when clock Φ3-2 rises from GND to Vcc, and a current can therefore hardly flow in reverse direction through the junction. This is also because a current can easily flow from capacitor C2 to capacitor C3, for example, since clock Φ3-3 falls quickly to GND at time t1.

Time for recovering from the reversely biased state (hereinafter called "reverse recovery time" can be acquired at a ramp part where the through rate is low on the voltage rising side. Hence, a charge pump circuit can be provided, in which a smaller current flows back, from the high-potential side to the low-potential side, than in the case no reverse recovery time is acquired.

As described above, the first embodiment can be applied to the charge pump circuit according to this embodiment. Therefore, the third embodiment can achieve the same advantages as the first embodiment.

Hence, the area the regions in which the capacitors are provided can be reduced in the third embodiment, as in the first and second embodiments.

(4) Fourth Embodiment

A semiconductor device (e.g., flash memory) according to a fourth embodiment will be described with reference to FIG. 18, FIG. 19 and FIG. 20.

In this embodiment, the clocks input to the charge pump circuit are four phase clocks. The features that distinguish this embodiment from the first to third embodiments will be mainly described.

FIG. 18 is an equivalent circuit diagram of the charge pump circuit of this embodiment.

The charge pump circuit 6 shown in FIG. 18 differs in terms of configuration from the charge pump circuits shown in FIG. 7 and FIG. 14, in the following respects.

In the charge pump circuit 6 of this embodiment, a clock Φ4-1 is input to two capacitors Cj connected to nodes Nj 5), at the other electrode (semiconductor region) thereof. A clock Φ4-2 is input to two capacitors C(j+1) connected to nodes N(j+1), at the other electrode (semiconductor region) thereof. A clock Φ4-3 is input to two capacitors C(j+2) connected to nodes N(j+2), at the other electrode (semiconductor region) thereof. A clock Φ4-4 is input to two capacitors C(j+3) connected to nodes N(j+3), at the other electrode (semiconductor region) thereof.

FIG. 19 shows the waveforms of the control signals (clocks) used in the charge pump circuit 6. As can be seen from FIG. 19, clocks Φ4-1, Φ4-2, Φ4-3 and Φ4-4 have waveforms shifted in phase with respect to one another by, for example, 90°. Unlike in the third embodiment, the leading edge and trailing edge of each clock have the same slope.

FIG. 20 shows the layout of capacitors C1 to C8 incorporated in the charge pump circuit 6 to which four phase clocks are input. This embodiment differs from the first to third embodiments, only in the number of capacitors provided in one semiconductor region. It is identical to the first to third embodiments in the sectional structure of the capacitors. Therefore, sectional structure of the capacitors will not described or shown in drawings.

As shown in FIG. 20, four semiconductor regions AAC-1, AAC-2, ACC-3 and AAC-4 are provided in the surface region of a semiconductor substrate 10, in association with the four clocks Φ4-1, Φ4-2, Φ4-3 and Φ4-4, respectively.

The four semiconductor regions AAC-1, AAC-2, ACC-3 and AAC-4 are surrounded by isolation regions STI, respectively, and are therefore electrically isolated from one another. Semiconductor regions AAC-1, AAC-2, ACC-3 and AAC-4 may be p-type well regions or n-type well regions. Alternatively, they may be p-type or n-type semiconductor substrates in which no well regions are provided.

Capacitors C1 to C9 form four groups, which are provided in four semiconductor regions AAC-1, AAC-2, AAC-3 and AAC-4, respectively, and to which the four clocks Φ4-1, Φ4-2, Φ4-3 and Φ4-4 are input, respectively.

Clock Φ4-1 is supplied through a contact plug CPA-1 to diffusion layer 32A-A provided in semiconductor region AAC-1. In semiconductor region AAC-1, capacitors C1 and C5 are provided to receive clock Φ4-1.

Clock Φ4-2 is supplied through a contact plug CPA-2 to diffusion layer 32A-B provided in semiconductor region AAC-2. In semiconductor region AAC-2, capacitors C2 and C6 are provided to receive clock Φ4-2.

Clock Φ4-3 is supplied through a contact plug CPA-3 to diffusion layer 32A-C provided in semiconductor region AAC-3. In semiconductor region AAC-3, capacitors C3 and C7 are provided to receive clock Φ4-3.

Clock Φ4-4 is supplied through a contact plug CPA-4 to diffusion layer 32A-D provided in semiconductor region AAC-4. In semiconductor region AAC-4, capacitors C4 and C8 are provided to receive clock Φ4-4.

Using four phase signals, the charge pump circuit 6 of FIG. 18 can efficiently transfer a charge, for reasons. As shown in FIG. 19, a current can hardly flow though a junction in the reverse direction since clock Φ4-1 is already at Vcc at time t2 when clock Φ4-2 rises from GND to Vcc. A current can easily flow, for example, from capacitor C2 to capacitor C3 since clock Φ4-3 is at GND at time t2. Moreover, a reverse recovery time can be acquired at a ramp part where the clock rises, as in the third embodiment. Hence, a charge pump circuit can be provided, in which a smaller current flows back, from the high-potential side to the low-potential side.

Also in the charge pump circuit 6 according to this embodiment, which receives four phase clocks, four groups of capacitors, each composed of two or more capacitors driven by the same clock, are provided in the four semiconductor regions AAC-1 to ACC-4, respectively. The flash memory according to this embodiment can therefore achieve the same advantage as the flash memory according to the first to third embodiments.

Hence, the area the regions in which the capacitors are provided can be reduced in the fourth embodiment, as in the first to third embodiments.

(5) Modification

Figure 21:
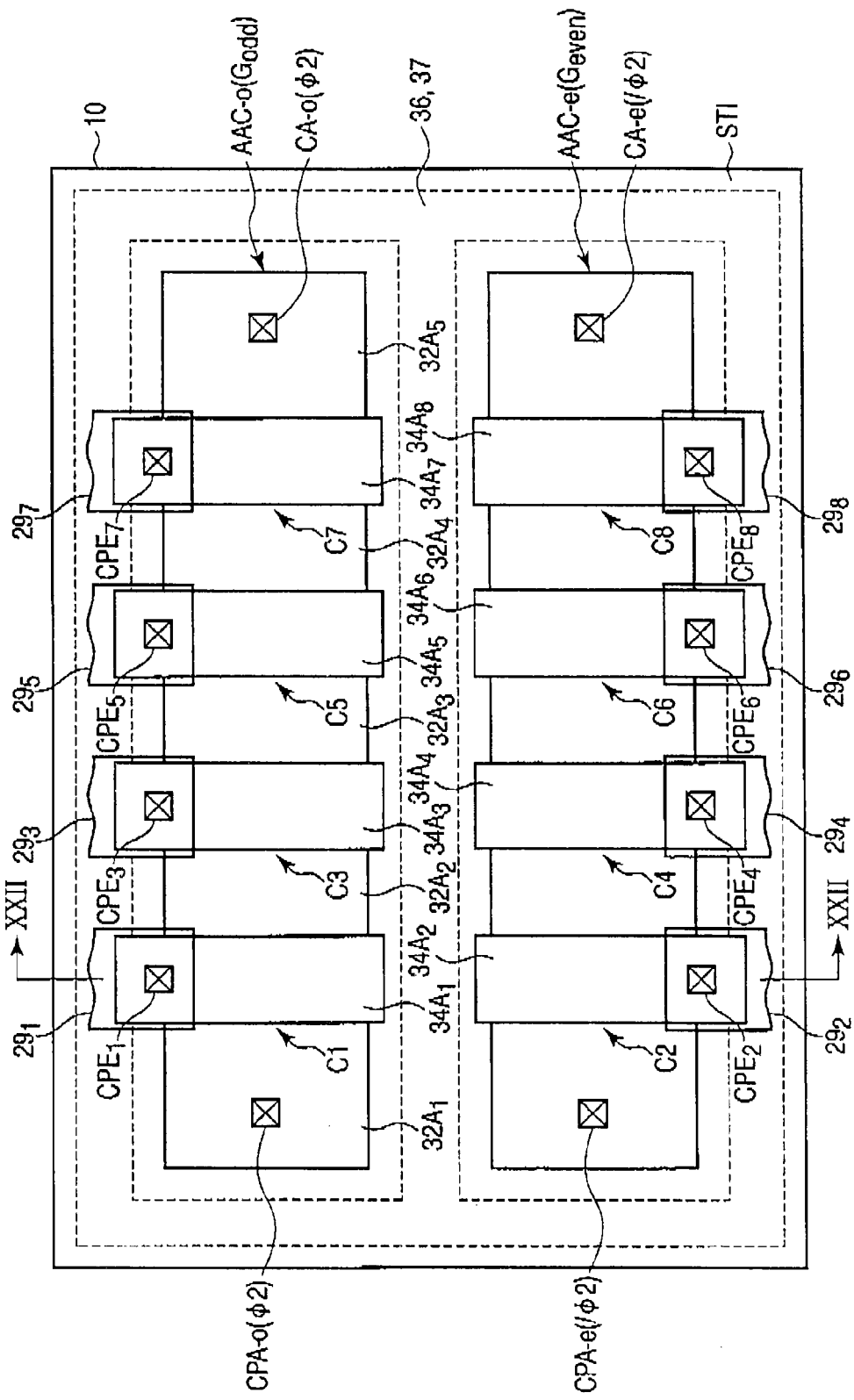
FIG. 21 is a plan view explaining a modification of the semiconductor devices according to the first to fourth embodiments.

A modification of the semiconductor devices according to the first to fourth embodiments will be described with reference to FIG. 21 and FIG. 22. FIG. 21 is a plan view showing the layout of capacitors provided in the modification. FIG. 22 is a sectional view taken along line XXII-XXII shown in FIG. 21.

In the modified semiconductor device, a ratio (hereinafter called "coverage ratio") is set for the area occupies of an element/line pattern in a prescribed area provided any interconnect level. That is, a particular coverage ratio is set for the area capacitor electrodes (or gate electrodes) occupy in one semiconductor region (element region).

In the first to fourth embodiments, the electrodes of any capacitor are formed on semiconductor regions only. However, the layout of the capacitor electrodes in the semiconductor region is not limited to the above-described one, so it achieves a prescribed coverage ratio.

For example, as shown in FIG. 21 and FIG. 22, capacitor electrodes $34A_1$ to $34A_8$ may not extend from semiconductor regions AAC-o and AAC-e to the isolation region (isolation insulating film) STI.

The diffusion layers 32B provided in semiconductor regions AAC-o and AAC-e have been formed in self-alignment, using capacitor electrodes $34A_1$ to $34A_8$ as mask. Therefore, any one of capacitor electrodes $34A_1$ to $34A_8$ is interposed between two of diffusion layers $32A_1$ to $32A_5$ in the layout shown in FIG. 21. That is, diffusion layers $32A_1$ to $32A_5$ of capacitors C1, C3, C5 and C7 are isolated from one another, not continuous to one another in semiconductor region AAC-o, in this modified semiconductor device. One capacitor electrode is, for example, sandwiched two diffusion layers. In the layout of FIG. 21, five diffusion layers $32A_1$, $32A_2$, $32A_3$, $32A_4$ and $32A_5$ are formed in one semiconductor region AAC-o. Thus, the capacitor group has two or more the diffusion layers sandwiching the each capacitor electrode.

Channels are therefore formed beneath capacitor electrodes $34A_1$, $34A_3$, $34A_5$ and $34A_7$ are when capacitors C1, C3, C5 and C7 are driven. Though diffusion layers $32A_1$ to $32A_5$ are not continuous to one another in semiconductor region AAC-o, through the channels thus formed, the potentials (clocks) Φ2 and /Φ2 applied are transferred to the adjacent capacitors C1, C3, C5 and C7.

In brief, it suffices to form at least one contact plug CPA on one of diffusion layers $32A_1$, $32A_2$, $32A_3$, $32A_4$ and $32A_5$ that are provided in the capacitor formation region AAC. As a result, the area the capacitors occupy can be decreased.

Moreover, contacts plugs $CPE_1$ to $CPE_8$ connected to capacitor electrodes $34A_1$ to $34A_8$, respectively, may be arranged above the isolation film STI.

Also in the modified semiconductor device shown in FIG. 21 and FIG. 22, the area the capacitors occupy can be reduced as in the first to fourth embodiments.

[Other Features]

The first to fourth embodiments described above are flash memories. In these embodiments, a two-dimensional memory cell array is formed in the surface region of a semiconductor substrate. The embodiments may, however, be applied to a flash memory having a three-dimensional memory cell array, such as a memory cell array of bit-cost scalable (BiCS) structure.

Further, the semiconductor devices according to the first to fourth embodiments are not limited to flash memories. They may be magnetoresistive random access memories (MRAMs), resistive random access memories (ReRAMs) or phase-change random access memories (PCRAMs).

Any one type of these memories may incorporate above-described capacitors provided in one semiconductor region and the above-described circuit (e.g., charge pump circuit) using these capacitors. Moreover, the semiconductor devices according to the embodiments are not limited to semiconductor memories. Rather, they may be embedded memories or logic LSIs.

In the first to fourth embodiments, a plurality of capacitors provided in one semiconductor region are used in a charge pump circuit. Nonetheless, capacitors provided in one semiconductor region may be used to form a circuit other than a charge pump circuit, in which the capacitors are controlled at one end (well region or substrate) by the same control signal (common potential level).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
  a memory cell array region and a charge pump region, both provided in a semiconductor substrate, the memory cell array region including an active region, and the charge pump region including first and second capacitor areas;
  a plurality of memory cells provided in the active region, each of the memory cells including a source and a drain shared by any adjacent memory cell, a tunnel insulating film provided on the active region, a charge storage layer provided on the tunnel insulating film, an insulator provided on the charge storage layer, and a control gate electrode provided on the insulator;
  a plurality of first capacitors provided in the first capacitor area, each of the first capacitors including a first capacitor insulating film provided on the first capacitor area, a first capacitor electrode provided on the first capacitor insulating film, and at least one first diffusion layer provided in the first capacitor area adjacent to the first capacitor electrode;
  a plurality of second capacitors provided in the second capacitor area, each of the second capacitors including a second capacitor insulating film provided on the second capacitor area, a second capacitor electrode provided on the second capacitor insulating film, and at least one second diffusion layer provided in the second capacitor area adjacent to the second capacitor electrode; and
  interconnects connected to the first and second capacitor electrodes, respectively,
  wherein the interconnects are electrically isolated from each other with respect to each of the capacitors, and different potentials are configured to be applied to the first and second capacitor electrodes, respectively, and
  wherein a potential of the at least one first diffusion layer in each first capacitor is configured to be controlled at a first common potential level and a potential of the at least one second diffusion layer in each second capacitor is configured to be controlled at a second common potential level.

2. The semiconductor device according to claim 1, wherein the first and second capacitors are components of a charge pump circuit provided in the charge pump region, the first capacitors form an odd-numbered capacitor group, and the second capacitors form an even-numbered capacitor group.

3. The semiconductor device according to claim 2, wherein the at least one first diffusion layer in each first capacitor is shared by at least two of the first capacitors.

4. The semiconductor device according to claim 2, wherein a the potential of the at least one first diffusion layer differs from the potential of the at least one second diffusion layer, while the charge pump circuit is operating.

5. The semiconductor device according to claim 1, wherein at least one of the first and second capacitor areas is an n-type semiconductor region.

6. A semiconductor device comprising:
- a memory cell array region and a charge pump region, both provided in a semiconductor substrate, the memory cell array region including an active region, and the charge pump region including first and second capacitor areas;
- a plurality of memory cells provided in the active region, each of the memory cells including a source and a drain shared by any adjacent memory cell, a tunnel insulating film provided on the active region, a charge storage layer provided on the tunnel insulating film, an insulator provided on the charge storage layer, and a control gate electrode provided on the insulator;
- a plurality of first capacitors provided in the first capacitor area, each of the first capacitors including a first capacitor insulating film provided on the first capacitor area, a first capacitor electrode provided on the first capacitor insulating film, and at least one first diffusion layer provided in the first capacitor area adjacent to the first capacitor electrode; and
- a plurality of second capacitors provided in the second capacitor area, each of the second capacitors including a second capacitor insulating film provided on the second capacitor area, a second capacitor electrode provided on the second capacitor insulating film, and at least one second diffusion layer provided in the second capacitor area adjacent to the second capacitor electrode;
- wherein a first distance between two first capacitors adjacent to each other is smaller than a second distance between the first and second capacitor areas, spaced apart by an isolation insulating film embedded in the semiconductor substrate.

* * * * *